US012796302B2

(12) United States Patent
Park et al.

(10) Patent No.: US 12,796,302 B2
(45) Date of Patent: Nov. 10, 2026

(54) DISPLAY PANEL AND METHOD OF MANUFACTURING THE SAME

(71) Applicant: Samsung Display Co., Ltd., Yongin-si (KR)

(72) Inventors: Heemin Park, Yongin-si (KR); Arong Kim, Yongin-si (KR); Youngmin Moon, Yongin-si (KR); Sungsoon Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 18/531,434

(22) Filed: Dec. 6, 2023

(65) Prior Publication Data

US 2024/0324430 A1 Sep. 26, 2024

(30) Foreign Application Priority Data

Mar. 22, 2023 (KR) ........................ 10-2023-0037563

(51) Int. Cl.

| | |
|---|---|
| ***H10K 59/80*** | (2023.01) |
| ***H10K 59/12*** | (2023.01) |
| ***H10K 59/122*** | (2023.01) |
| ***H10K 59/123*** | (2023.01) |
| ***H10K 59/131*** | (2023.01) |

(52) U.S. Cl.

CPC ..... *H10K 59/8794* (2023.02); *H10K 59/1201* (2023.02); *H10K 59/122* (2023.02); *H10K 59/123* (2023.02); *H10K 59/131* (2023.02)

(58) Field of Classification Search

CPC ............. H10K 59/8794; H10K 59/131; H10K 59/1201

USPC ............................................................ 257/40

See application file for complete search history.

(56) References Cited

U.S. PATENT DOCUMENTS

| | | | | |
|---|---|---|---|---|
| 11,489,023 | B2 | 11/2022 | Son et al. | |
| 2022/0140062 | A1* | 5/2022 | Lee | H10K 59/1201 257/40 |
| 2022/0165827 | A1* | 5/2022 | Xu | H10K 59/1201 |
| 2022/0406877 | A1* | 12/2022 | Cha | H10K 59/121 |

FOREIGN PATENT DOCUMENTS

| | | | |
|---|---|---|---|
| CN | 106505152 | B | 7/2019 |
| KR | 10-2021-0020188 | A | 2/2021 |
| KR | 10-2021-0055823 | A | 5/2021 |

* cited by examiner

*Primary Examiner* — Xia L Cross

(74) *Attorney, Agent, or Firm* — Womble Bond Dickinson (US) LLP

(57) ABSTRACT

A display panel includes: a base substrate including a display area, and a hole area having a hole defined therein; a light emitting element in the display area, and including: a pixel electrode on the base substrate; a light emitting layer on the pixel electrode; and a common control layer on the pixel electrode; a heating line surrounding the hole in the hole area; and a signal transmission line connected to the heating line, and electrically insulated from the light emitting element. The common control layer is spaced from the heating line.

18 Claims, 19 Drawing Sheets

DISPLAY PANEL AND METHOD OF MANUFACTURING THE SAME

CROSS-REFERENCE TO RELATED APPLICATION

The present application claims priority to and the benefit of Korean Patent Application No. 10-2023-0037563, filed on Mar. 22, 2023, in the Korean Intellectual Property Office, the entire disclosure of which is incorporated by reference herein.

BACKGROUND

1. Field

Aspects of embodiments of the present disclosure relate to a display panel, and a method of manufacturing the display panel. More particularly, aspects of embodiments of the present disclosure relate to a display panel including a hole defined therethrough, and a method of manufacturing the display panel.

2. Description of the Related Art

Electronic devices that provide images to users, such as a television, a mobile phone, a tablet computer, a computer, a navigation unit, and a game unit, include a display panel to generate and display the images. The electronic devices further include an electronic module, such as a camera, an optical sensor, and the like, in addition to the display panel.

In recent years, research on a method of decreasing a bezel area have been ongoing to provide a wider display surface to the users. As an example, the electronic module may be disposed under the display panel, and a hole may be defined through the display panel to improve a driving efficiency of the electronic module.

The above information disclosed in this Background section is for enhancement of understanding of the background of the present disclosure, and therefore, it may contain information that does not constitute prior art.

SUMMARY

One or more embodiments of the present disclosure are directed to a display panel, and a method of manufacturing the display panel that reduces damage that may be caused on components of the display panel, and blocks a continuity of a common layer disposed adjacent to a hole.

According to one or more embodiments of the present disclosure, a display panel includes: a base substrate including a display area, and a hole area having a hole defined therein; a light emitting element in the display area, and including: a pixel electrode on the base substrate; a light emitting layer on the pixel electrode; and a common control layer on the pixel electrode; a heating line surrounding the hole in the hole area; and a signal transmission line connected to the heating line, and electrically insulated from the light emitting element. The common control layer is spaced from the heating line.

In an embodiment, the heating line may have a line width smaller than a line width of the signal transmission line.

In an embodiment, the heating line may include at least one of molybdenum (Mo), copper (Cu), tungsten (W), gold (Au), silver (Ag), indium tin oxide (ITO), indium zinc oxide (IZO), or indium tin gallium oxide (ITGO).

In an embodiment, the heating line may include the same material as that of the pixel electrode.

In an embodiment, the heating line may include the same material as that of the signal transmission line.

In an embodiment, the heating line may have a closed-loop shape corresponding to an outer line of the hole.

In an embodiment, the common control layer may further include a protruding portion adjacent to an end of the common control layer facing the heating line.

In an embodiment, the signal transmission line may be located at the same layer as that of the pixel electrode.

In an embodiment, the signal transmission line may extend from the heating line via the display area, and the signal transmission line may be spaced from the pixel electrode in the display area.

In an embodiment, a portion of the signal transmission line may overlap with the common control layer, and an end of the signal transmission line may not overlap with the common control layer.

In an embodiment, the display panel may further include a pixel definition layer on the pixel electrode, and defining a light emitting opening overlapping with the pixel electrode. The signal transmission line may overlap with the pixel definition layer, and the heating line may not overlap with the pixel definition layer.

In an embodiment, the common control layer include at least one of a hole control layer or an electron control layer on the light emitting layer.

In an embodiment, the display panel may further include a dam surrounding the hole in the hole area, and the heating line may be spaced from the dam.

In an embodiment, the dam may include: a first dam; and a second dam located closer to the hole compared to the first dam. The heating line may be located between the first dam and the second dam in the hole area.

In an embodiment, the display panel may further include a barrier portion in contact with a rear surface of the heating line, and the barrier portion may have a thermal conductivity lower than a thermal conductivity of the heating line.

In an embodiment, the barrier portion may surround the hole to correspond to a location of the heating line.

In an embodiment, the barrier portion may cover at least a portion of a side surface of the heating line.

In an embodiment, the barrier portion may include at least one of titanium (Ti), lead (Pb), aluminum oxide (AlOx), polyimide (PI), silicon oxide (SiOx), or silicon nitride (SiNx).

According to one or more embodiments of the present disclosure, a method of manufacturing a display panel, includes: providing a preliminary display panel, the preliminary display panel including: a pixel electrode in a display area; a heating line in a hole area; and a signal transmission line connected to the heating line; forming a preliminary common control layer on the pixel electrode and the heating line; applying a pulse voltage to the signal transmission line to generate heat in the heating line; and removing a portion of the preliminary common control layer on the heating line using the heat to form a common control layer spaced from the heating line.

In an embodiment, the providing of the preliminary display panel may include forming the pixel electrode, the heating line, and the signal transmission line concurrently with each other through the same process.

According to one or more embodiments of the present disclosure, the display panel may include the heating line disposed in the hole area, and a portion of the common control layer formed on the heating line may be removed by the heat generated in the heating line. Accordingly, a continuity of the common control layer may be blocked in the hole area. Thus, as an additional structure to block the continuity of the common control layer in the hole area is not required, a margin in the hole area may be reduced, and it may be possible to expand the display area.

According to one or more embodiments of the present disclosure, the heating line may be formed together with the pixel electrode through the same process, and thus, an addition process for forming the heating line may not be required.

BRIEF DESCRIPTION OF THE DRAWINGS

The above and other aspects and features of the present disclosure will be more clearly understood from the following detailed description of the illustrative, non-limiting embodiments with reference to the accompanying drawings, wherein.

DETAILED DESCRIPTION

Figure 1:
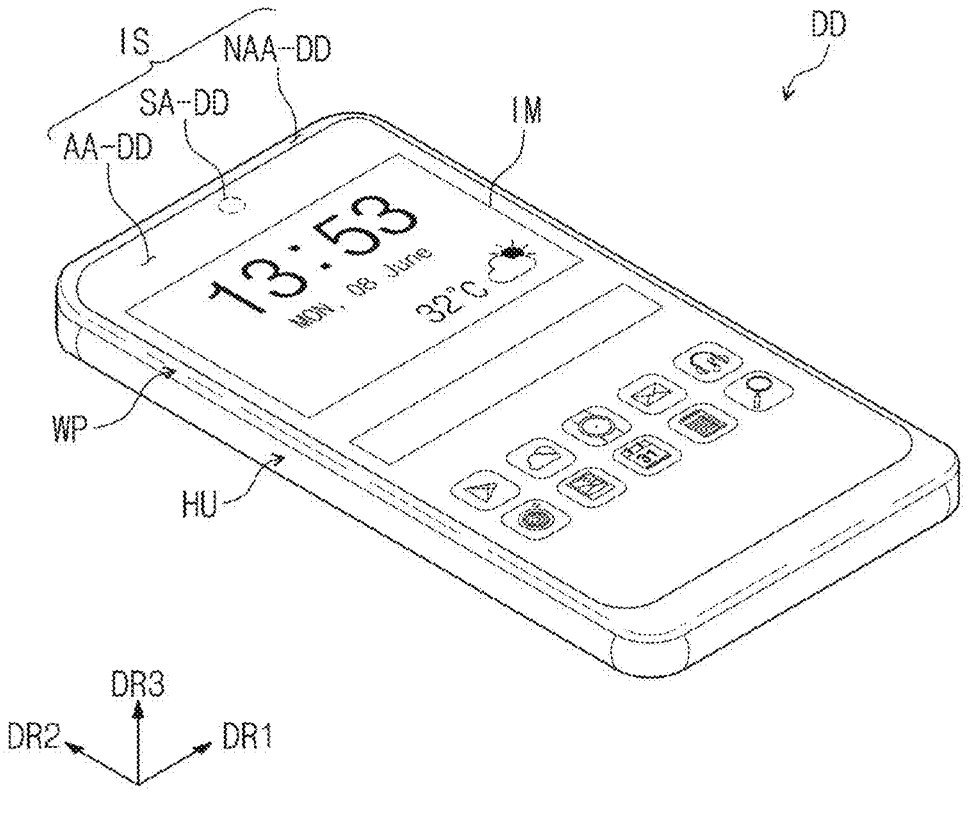
FIG. 1 is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
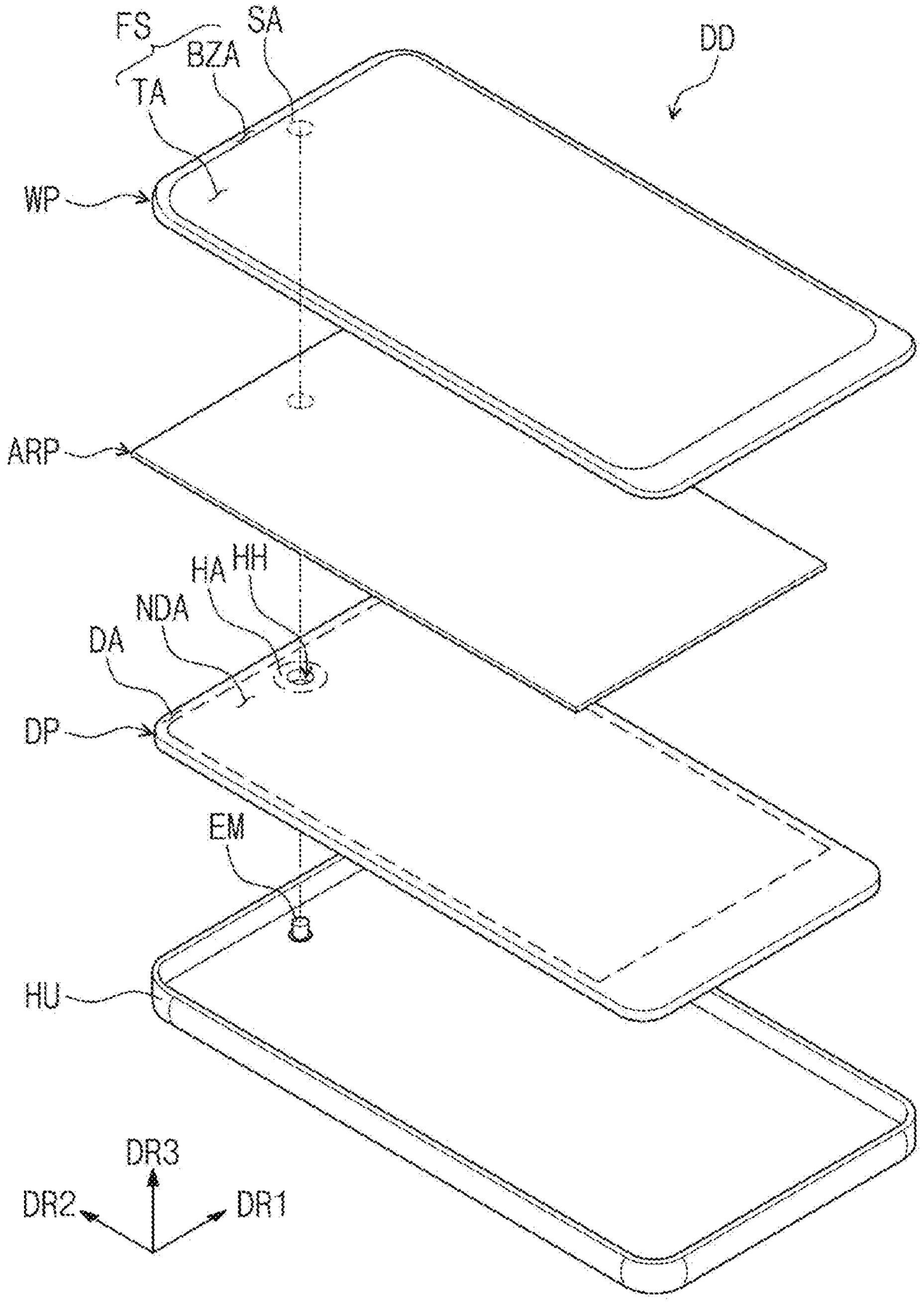
FIG. 2 is an exploded perspective view of an electronic device according to an embodiment of the present disclosure.

FIG. 1 is a perspective view of an electronic device DD according to an embodiment of the present disclosure. FIG. 2 is an exploded perspective view of the electronic device DD according to an embodiment of the present disclosure.

The electronic device DD may be activated in response to electrical signals, and may display an image IM. The electronic device DD may include various embodiments to provide the image IM to a user. As an example, the electronic device DD may be applied to a large-sized electronic device, such as a television set, an outdoor billboard, and the like, as well as a small and medium-sized electronic device, such as a monitor, a mobile phone, a tablet computer, a computer, a navigation unit (e.g., a navigation device), a game unit (e.g., a game console), and the like. However, the present disclosure is not limited thereto, and the electronic device DD may be applied to other suitable electronic devices that display images. In the present embodiment, a mobile phone is illustrated as a representative example of the electronic device DD for convenience.

Referring to FIG. 1, the electronic device DD may have a rectangular shape with short sides extending in a first direction DR1, and long sides extending in a second direction DR2 crossing (e.g., intersecting) the first direction DR1 when viewed in a plane (e.g., in a plan view). However, the shape of the electronic device DD is not limited to the rectangular shape, and the electronic device DD may have a variety of suitable shapes, such as another polygonal shape, a circular shape, an oval shape, or the like.

The electronic device DD may display the image IM through a display surface IS toward a third direction DR3 perpendicular to or substantially perpendicular to a plane defined by the first direction DR1 and the second direction DR2. A normal line direction of the display surface IS may be parallel to or substantially parallel to the third direction DR3. The display surface IS of the electronic device DD may correspond to the front surface of the electronic device DD. The image IM displayed through the electronic device DD may include a still image as well as a video. FIG. 1 shows a clock widget and application icons as a representative example of the image IM.

Front (or upper) and rear (or lower) surfaces of each member (e.g., each unit, layer, component, and the like) of the electronic device DD may be defined with respect to the direction in which the image IM is displayed. The front and rear surfaces may be opposite to each other in the third direction DR3, and a normal line direction of each of the front and rear surfaces may be parallel to or substantially parallel to the third direction DR3. A separation distance between the front and rear surfaces of each member in the third direction DR3 may correspond to a thickness of the member in the third direction DR3.

As used in the present disclosure, the expressions "when viewed in a plane" and "in a plan view" may refer to a state of being viewed in the third direction DR3. As used in the present disclosure, the expressions "when viewed in a cross-section" and "in a cross-sectional view" may refer to a state of being viewed in the first direction DR1 or the second direction DR2. Further, the directions indicated by the first, second, and third directions DR1, DR2, and DR3 are relative to each other, and thus, the directions indicated by the first, second, and third directions DR1, DR2, and DR3 may be variously modified to other suitable directions.

The electronic device DD may be flexible. The term "flexible" as used herein refers to the property of being able to be bent from a structure that is completely bent to a structure that is bent at the scale of a few nanometers. For example, the electronic device DD may be a curved electronic device or a foldable electronic device. However, the present disclosure is not limited thereto, and the electronic device DD may be rigid.

FIG. 1 shows the electronic device DD including the display surface IS that is flat as a representative example. However, the shape of the display surface IS of the electronic device DD is not limited thereto or thereby, and the display surface IS may further include a curved surface bent from the plane.

The display surface IS of the electronic device DD may include a display part AA-DD and a non-display part NAA-DD. The display part AA-DD may be a part where the image IM is displayed within the front surface of the electronic device DD, and the user may view the image IM through the display part AA-DD. In the present embodiment, the display part AA-DD having a quadrangular shape in a plane (e.g., in a plan view) is illustrated as a representative example, however, the display part AA-DD may have a variety of suitable shapes depending on a desired design of the electronic device DD.

The non-display part NAA-DD may be a part where the image IM is not displayed within the front surface of the electronic device DD. The non-display part NAA-DD may have a suitable color (e.g., a predetermined color), and may block light. The non-display part NAA-DD may be disposed adjacent to the display part AA-DD. As an example, the non-display part NAA-DD may be disposed outside of the display part AA-DD, and may surround (e.g., around a periphery of) the display part AA-DD, but the present disclosure is not limited thereto. The non-display part NAA-DD may be defined to be adjacent to only one side of the display part AA-DD, or may be defined in a side surface instead of the front surface of the electronic device DD.

According to an embodiment, the non-display part NAA-DD may be omitted as needed or desired.

According to an embodiment, the display part AA-DD of the electronic device DD may include a sensing area SA-DD defined therein. The sensing area SA-DD may correspond to an area overlapping with an electronic module (e.g., an electronic component or sensor) EM of FIG. 2. The electronic module EM (e.g., refer to FIG. 2) may receive signals from the outside, or may provide signals to the outside through the sensing area SA-DD. FIG. 1 shows one sensing area SA-DD disposed in the display part AA-DD as a representative example, however, the present disclosure is not limited thereto or thereby. According to an embodiment, the sensing area SA-DD may be provided in a plurality in the display part AA-DD.

According to an embodiment, the electronic device DD may sense an external input applied thereto from the outside. The external input may include a variety of suitable external inputs provided from the outside, such as pressure, temperature, light, and the like. The external input may include a proximity input (e.g., a hovering input) applied when an object or a part of the user's body (e.g., finger) approaches close to the electronic device DD at a suitable distance (e.g., a predetermined distance), as well as a touch input (e.g., a touch by the hand of the user or object such as a pen).

Referring to FIGS. 1 and 2, the electronic device DD may include a window WP and a housing HU. The window WP and the housing HU may be coupled to (e.g., connected to or attached to) each other to provide an exterior of the electronic device DD, and to provide an inner space in which the components of the electronic device DD are accommodated. The electronic device DD may include a display panel DP, an anti-reflective member ARP, and the electronic module EM, which are disposed between the window WP and the housing HU.

The electronic module EM may be disposed under the display panel DP. The electronic module EM may be disposed to overlap with the display panel DP. The electronic module EM may be an electronic component or sensor that outputs or receives an optical signal. For example, the electronic module EM may include a camera module (e.g., a camera) that photographs an image of an external object, a proximity sensor that recognizes the external object approaching thereto using an optical signal, or an infrared ray emission sensor that outputs an optical signal.

The display panel DP may display the image IM in response to electrical signals. The display panel DP may be a light emitting kind of display panel. For example, the display panel DP may be an organic light emitting display panel, an inorganic light emitting display panel, or a quantum dot light emitting display panel. Hereinafter, the organic light emitting display panel will be described in more detail as a representative example of the display panel DP for convenience.

The display panel DP may include a display area DA, and a non-display area NDA defined adjacent to the display area DA. The non-display area NDA may surround (e.g., around a periphery of) the display area DA when viewed in the plane (e.g., in a plan view). The display area DA may display the image IM in response to the electrical signals. The non-display area NDA may not display the image IM. A driving circuit, lines, and pads to drive light emitting elements disposed in the display area DA may be disposed in the non-display area NDA.

The display panel DP may include a hole area HA defined within the display area DA. The hole area HA may overlap with the sensing area SA-DD. The hole area HA may overlap with the electronic module EM. In the present disclosure, the expression "one area/portion overlaps with another area/portion" should not be interpreted as being limited to having the same size or the same shape as each other.

At least a portion of the hole area HA may be surrounded (e.g., around a periphery thereof) by the display area DA. The hole area HA may be completely surrounded (e.g., around a periphery thereof) by the display area DA, but the present disclosure is not limited thereto. According to an embodiment, a portion of the hole area HA may be in contact with the display area DA, and another portion of the hole area HA may be in contact with the non-display area NDA.

A hole HH may be defined through (e.g., may penetrate) the display panel DP in the hole area HA. The hole HH may be formed through at least a portion of a component of the display panel DP, which is disposed in the hole area HA.

The electronic module EM may overlap with the hole HH. At least a portion of the electronic module EM may be exposed to the outside through the hole HH. At least a portion of the electronic module EM may be inserted into the hole HH.

The anti-reflective member ARP may be disposed between the display panel DP and the window WP. The anti-reflective member ARP may reduce a reflection of external light incident thereto from the outside of the electronic device DD. In other words, the anti-reflective member ARP may reduce the reflectance of the electronic device DD with respect to the external light. The anti-reflective member ARP may include a polarizer, a retarder, a destructive interference structure, or a plurality of color filters, which reduce the reflectance of the electronic device DD with respect to the external light.

A portion of the anti-reflective member ARP, which overlaps with the hole area HA, may have a relatively high light transmittance. As an example, the anti-reflective member ARP may include a transmission portion overlapping with the hole area HA. However, the present disclosure is not limited thereto or thereby, and the anti-reflective member ARP may be provided with a through hole defined therethrough and overlapping with the hole area HA.

The window WP may be disposed on the anti-reflective member ARP. The window WP may protect the display panel DP and the anti-reflective member ARP, which are disposed under the window WP.

The window WP may include an optically transparent insulating material. As an example, the window WP may include glass, sapphire, or a plastic material. The window WP may have a single-layer or multi-layered structure. The window WP may further include functional layers, such as an anti-fingerprint layer, a phase control layer, a hard coating layer, and/or the like, disposed on an optically transparent substrate.

A front surface FS of the window WP may correspond to the display surface IS of the electronic device DD. The front surface FS of the window WP may include a transmission area TA and a bezel area BZA.

The transmission area TA of the window WP may be an optically transparent area. The transmission area TA of the window WP may correspond to the display part AA-DD of the electronic device DD. The transmission area TA may overlap with at least a portion of the display area DA of the display panel DP. The window WP may transmit the image IM provided from the display panel DP through the transmission area TA, and the user may view the image IM.

The transmission area TA of the window WP may overlap with the hole area HA. A portion of the transmission area TA overlapping with the hole area HA may be defined as a sensing area SA. The sensing area SA may correspond to the sensing area SA-DD of the electronic device DD. The sensing area SA of the window WP may overlap with the electronic module EM.

The sensing area SA overlapping with the electronic module EM may be optically transparent, and may have a relatively high light transmittance. As the hole HH overlapping with the electronic module EM is formed by removing the components of the display panel DP, the electronic module EM may easily receive the optical signal incident thereto from the outside through the sensing area SA and the hole HH, or may output the optical signal to the outside through the sensing area SA and the hole HH.

The bezel area BZA of the window WP may be obtained by depositing, coating, or printing a material having a suitable color (e.g., a predetermined color) on a transparent substrate. The bezel area BZA may correspond to the non-display part NAA-DD of the electronic device DD. The bezel area BZA may overlap with at least a portion of the non-display area NDA of the display panel DP. Because the bezel area BZA of the window WM covers the non-display area NDA of the display panel DP, components of the display panel DP, which are disposed in the non-display area NDA, may be prevented or substantially prevented from being viewed from the outside.

The housing HU may be disposed under the display panel DP. The housing HU may protect the display panel DP and the anti-reflective member ARP, which are accommodated therein. The housing HU may prevent or substantially prevent a foreign substance and/or moisture from entering the display panel DP and the anti-reflective member ARP. The housing HU may include a material with a relatively high strength, and may absorb impacts applied thereto from the outside of the housing HU. According to an embodiment, the housing HU may be provided in a form obtained by coupling a plurality of accommodating members to each other.

The electronic device DD may further include an input sensor disposed on the display panel DP. The input sensor may be disposed directly on the display panel DP, and may be in contact with the display panel DP without a separate adhesive layer, but the present disclosure is not limited thereto or thereby. In some embodiments, the input sensor may be coupled with the display panel DP by an adhesive layer. The input sensor may obtain coordinate information of the external input applied thereto from the outside of the electronic device DD. The input sensor may be driven in various suitable ways, such as a capacitive method, a resistive method, an infrared ray method, a pressure method, or the like, but is not particularly limited thereto.

Figure 3:
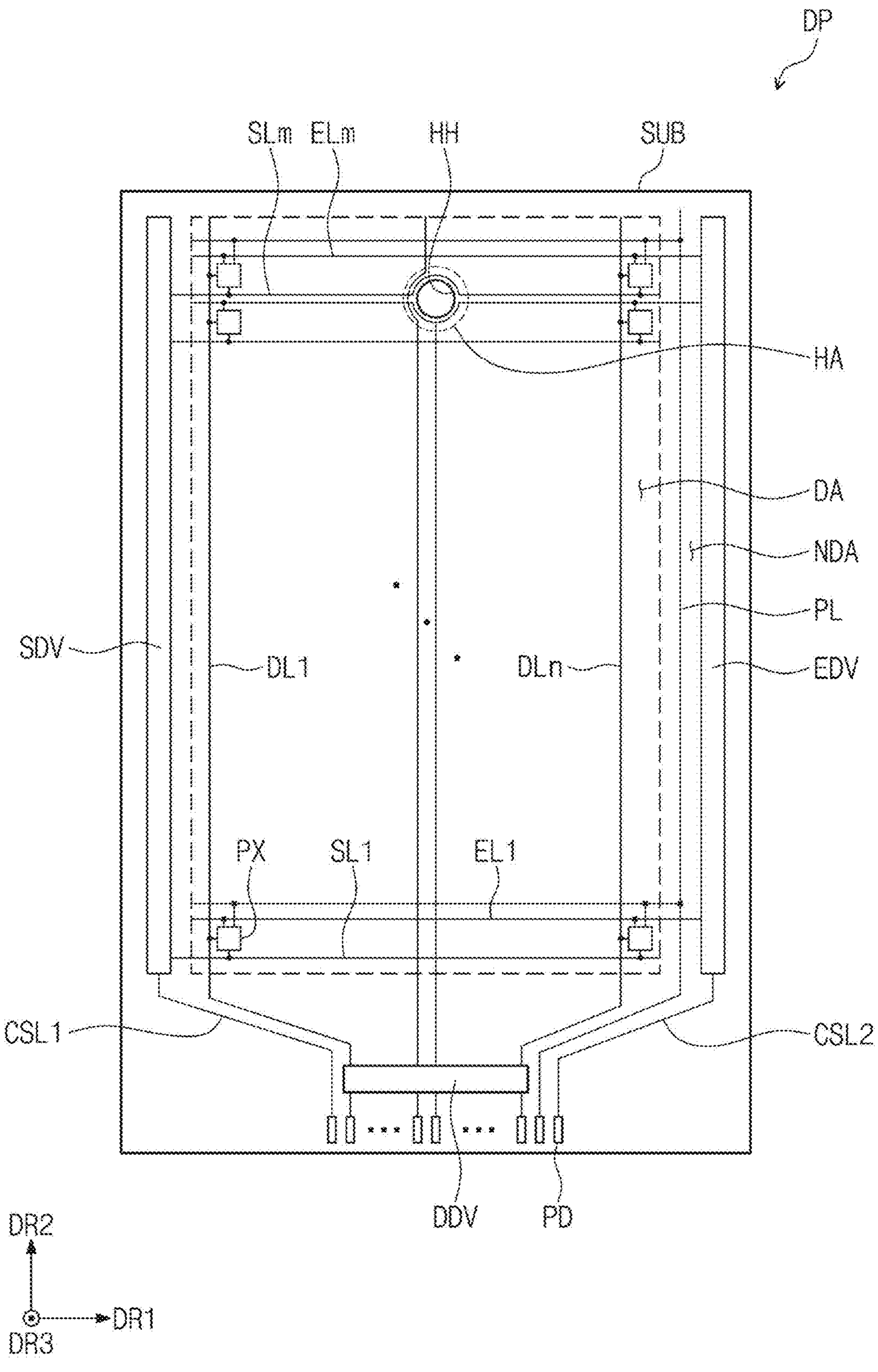
FIG. 3 is a plan view of a display panel according to an embodiment of the present disclosure.

FIG. 3 is a plan view of the display panel DP according to an embodiment of the present disclosure. FIG. 3 schematically shows components of the display panel DP when viewed in the plane (e.g., in a plan view).

Referring to FIG. 3, the display panel DP may include a base substrate SUB, pixels PX, a plurality of signal lines SL1 to SLm, DL1 to DLn, EL1 to ELm, CSL1, CSL2, and PL electrically connected to the pixels PX, a scan driver SDV, a data driver DDV, an emission driver EDV, and a plurality of pads PD.

The base substrate SUB may provide a base surface on which the elements and the lines of the display panel DP are disposed. The base substrate SUB may include a display area DA and a non-display area NDA, which correspond to the display area DA and the non-display area NDA of the display panel DP, respectively. FIG. 3 shows the base substrate SUB having a rectangular shape that is parallel to or substantially parallel to each of the first direction DR1 and the second direction DR2 when viewed in the plane (e.g., in a plan view) as a representative example, but the shape of the base substrate SUB is not limited thereto or thereby. The base substrate SUB may be manufactured in various suitable shapes depending on a desired design of the electronic device DD (e.g., refer to FIG. 1).

The base substrate SUB may include the hole area HA, and at least a portion of the hole area HA may be surrounded (e.g., around a periphery thereof) by the display area DA. The pixels PX may be spaced apart from the hole area HA, and may be disposed in the display area DA. The hole HH may be defined through (e.g., may penetrate) the display panel DP in the hole area HA. The hole HH may be formed through the base substrate SUB. Due to the hole HH, the hole area HA may have a light transmittance relatively higher than that of the display area DA in which the pixels PX are disposed.

Some signal lines from among the signal lines SL1 to SLm, DL1 to DLn, EL1 to ELm, CSL1, CSL2, and PL may extend in the display area DA via the hole area HA. Accordingly, some signal lines may include a curved line extending along a boundary of the hole HH, but are not limited thereto or thereby. According to an embodiment, a separate bridge pattern, which is distinguished from the signal line that is disposed adjacent to the hole area HA, may be disposed in the hole area HA, and the bridge pattern may be electrically connected to the signal lines. The signal lines SL1 to SLm, DL1 to DLn, EL1 to ELm, CSL1, CSL2, and PL may pass through the hole area HA in various suitable ways, and are not particularly limited.

As some of the signal lines SL1 to SLm, DL1 to DLn, EL1 to ELm, CSL1, CSL2, and PL extend passing through the hole area HA and transmit electrical signals, the pixels PX that are spaced apart from each other with the hole HH interposed therebetween may be electrically connected to each other. In other words, the electrical signals may be provided to the entire display area DA without being interrupted by the hole HH.

Each of the pixels PX may include a pixel driving circuit including a plurality of transistors (e.g., a switching transistor, a driving transistor, and/or the like) and at least one capacitor, and a light emitting element connected to the pixel driving circuit. Each of the pixels PX may be arranged in the display area DA, and may emit light in response to an electrical signal applied thereto.

Each of the scan driver SDV, the data driver DDV, and the emission driver EDV may be disposed in the non-display area NDA of the display panel DP, but the present disclosure is not limited thereto. According to an embodiment, at least one of the scan driver SDV, the data driver DDV, or the emission driver EDV may be disposed to overlap with the display area DA, and thus, a size of the non-display area NDA may be reduced.

The data driver DDV may be manufactured in an integrated circuit chip form defined as a driving chip, and may be mounted in the non-display area NDA of the display panel DP, but the present disclosure is not limited thereto. According to an embodiment, the data driver DDV may be mounted on a separate flexible circuit board connected to the display panel DP.

The signal lines SL1 to SLm, DL1 to DLn, EL1 to ELm, CSL1, CSL2, and PL may include a plurality of scan lines SL1 to SLm, a plurality of data lines DL1 to DLn, a plurality of emission lines EL1 to ELm, first and second control lines CSL1 and CSL2, and a power line PL. Here, each of "m" and "n" is a natural number.

The scan lines SL1 to SLm may extend in the first direction DR1 or a direction opposite to the first direction DR1, and may be connected to the scan driver SDV. The data lines DL1 to DLn may extend in the second direction DR2 or a direction opposite to the second direction DR2, and may be electrically connected to the data driver DDV. The emission lines EL1 to ELm may extend in the first direction DR1, and may be electrically connected to the emission driver EDV.

The power line PL may extend in the second direction DR2, and may be disposed in the non-display area NDA. The power line PL may be electrically connected to the pixels PX via connection lines connected to the pixels PX, and may apply a voltage (e.g., a predetermined voltage) to the pixels PX.

The first control line CSL1 may be electrically connected to the scan driver SDV. The second control line CSL2 may be connected to the emission driver EDV.

The pads PD may be disposed adjacent to a lower end of the non-display area NDA. The pads PD may be disposed closer to the lower end of the display panel DP than (e.g., compared to) the data driver DDV. The pads PD may be arranged along the first direction DR1. The pads PD may be connected to a circuit board including a timing controller to control an operation of the scan driver SDV, the data driver DDV, and the emission driver EDV, and a voltage generator to generate a voltage.

Each of the pads PD may be connected to a corresponding signal line from among the signal lines SL1 to SLm, DL1 to DLn, EL1 to ELm, CSL1, CSL2, and PL. As an example, the data lines DL1 to DLn, the power line PL, and the first and second control lines CSL1 and CSL2 may be electrically connected to the pads PD.

The scan driver SDV may generate a plurality of scan signals in response to a scan control signal. The scan signals may be applied to the pixels PX via the scan lines SL1 to SLm. The data driver DDV may generate a plurality of data voltages corresponding to image signals in response to a data control signal. The data voltages may be applied to the pixels PX via the data lines DL1 to DLn. The emission driver EDV may generate a plurality of emission signals in response to an emission control signal. The emission signals may be applied to the pixels PX via the emission lines EL1 to ELm.

The pixels PX may receive the data voltages in response to the scan signals. The pixels PX may emit light having a luminance corresponding to the data voltages in response to the emission signals, and thus, the image may be displayed. An emission time of the pixels PX may be controlled by the emission signals. Accordingly, the display panel DP may display the image through the display area DA using the pixels PX.

Figure 4:
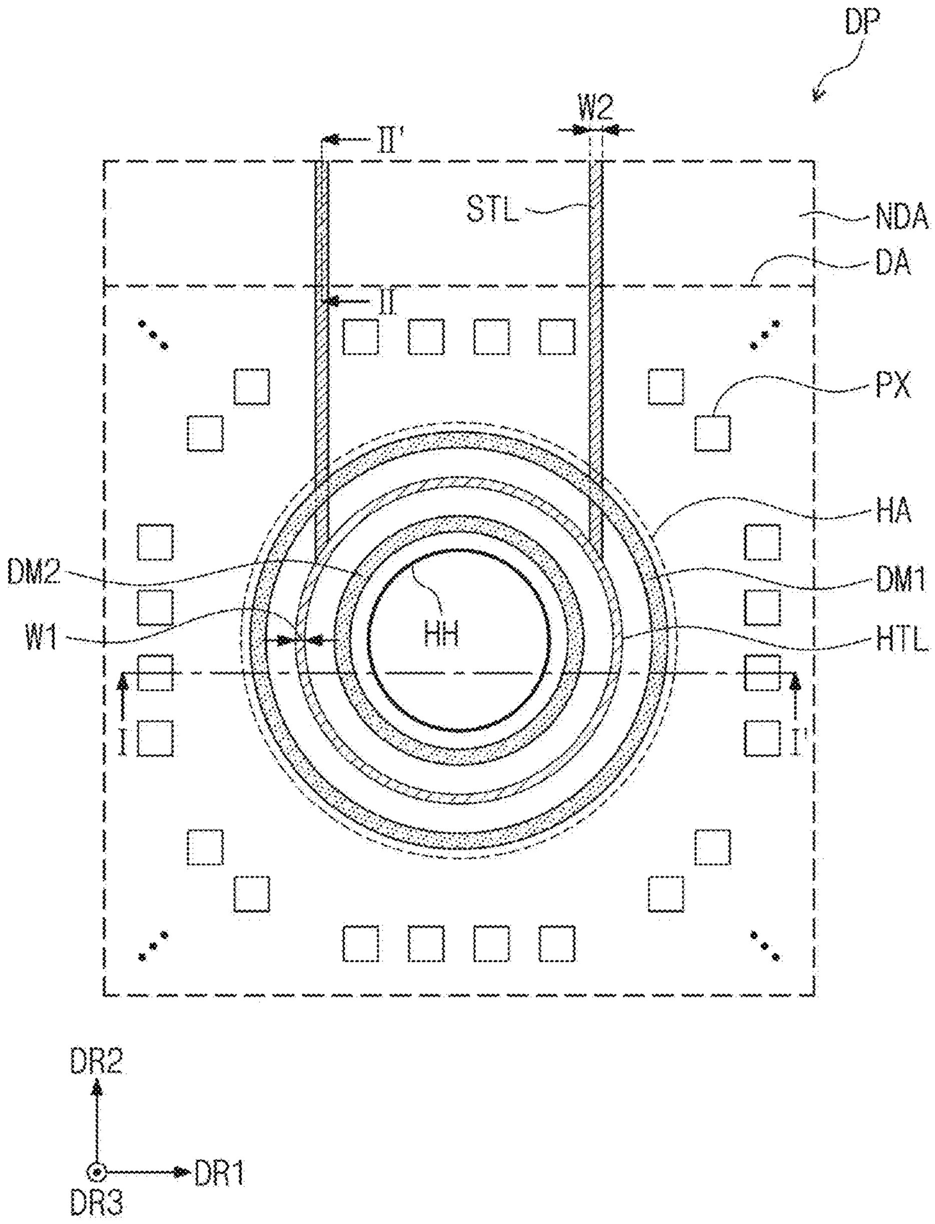
FIG. 4 is an enlarged plan view of an area of a portion of a display panel according to an embodiment of the present disclosure.

FIG. 4 is an enlarged plan view of an area of a portion of the display panel DP according to an embodiment of the present disclosure. FIG. 4 schematically shows the components of the display panel DP corresponding to the display area DA including the hole area HA, and the non-display area NDA adjacent to the display area DA.

Referring to FIG. 4, the display panel DP may include at least one dam DM1 and DM2 disposed in the hole area HA. FIG. 4 shows a plurality of dams DM1 and DM2 disposed in the hole area HA as a representative example. The dams DM1 and DM2 may include a first dam DM1 and a second dam DM2. However, the number of the dams DM1 and DM2 disposed in the hole area HA is not particularly limited thereto.

The first dam DM1 and the second dam DM2 may be disposed to be spaced apart from each other. The first dam DM1 may be disposed closer to the display area DA in which the pixels PX are arranged than the second dam DM2. The second dam DM2 may be disposed closer to the hole HH than the first dam DM1. In other words, the second dam DM2 may be disposed between the first dam DM1 and the hole HH.

The first dam DM1 and the second dam DM2 may be disposed to surround (e.g., around a periphery of) the hole HH when viewed in the plane (e.g., in a plan view). The first dam DM1 and the second dam DM2 may have a closed-loop shape. The first dam DM1 and the second dam DM2 may have a shape corresponding to an outer line of the hole HH. As an example, the hole HH may have a circular shape when viewed in the plane (e.g., in a plan view), and each of the first dam DM1 and the second dam DM2 may have a circular ring shape, but the present disclosure is not limited thereto or thereby.

The first dam DM1 and the second dam DM2 may protrude in the thickness direction (e.g., the third direction DR3) of the display panel DP. The first dam DM1 and the second dam DM2 may define an area in which an organic layer MN (e.g., refer to FIG. 5A) of an encapsulation layer TFE described in more detail below is formed, and may block a continuity of the organic layer MN in the hole area HA.

The hole HH may be defined in the hole area HA. FIG. 4 shows a structure in which one hole HH is defined in the hole area HA, but the present disclosure is not limited thereto or thereby, and the hole HH may be provided in a plurality in one hole area HA. According to an embodiment, the hole area HA may be provided in a plurality, the hole areas HA may be spaced apart from each other in the display area DA, and a hole HH may be defined in each of the hole areas HA.

The display panel DP may include a heating line HTL, and a signal transmission line STL connected to the heating line HTL.

The heating line HTL may be disposed to be adjacent to the hole HH. As an example, the heating line HTL may be disposed between the first dam DM1 and the second dam DM2 when viewed in the plane (e.g., in a plan view). However, the location of the heating line HTL is not particularly limited, as long as the heating line HTL is disposed to be adjacent to the hole HH around the hole HH.

The heating line HTL may surround (e.g., around a periphery of) the hole HH when viewed in the plane (e.g., in a plan view). The heating line HTL may have a closed-loop shape to surround (e.g., around a periphery of) the hole HH. The heating line HTL may have a shape corresponding to the outer line of the hole HH. As an example, the hole HH may have a circular shape when viewed in the plane (e.g., in a plan view), and the heating line HTL may have a circular ring shape, but the present disclosure is not limited thereto.

The signal transmission line STL may extend from the heating line HTL. The signal transmission line STL may be provided integrally with the heating line HTL. The signal transmission line STL may be provided in a plurality, and the signal transmission lines STL may be connected to the same heating line HTL. As an example, the signal transmission lines STL may be connected to left and right sides of the heating line HTL, respectively.

The signal transmission line STL may extend from the heating line HTL to the outside of the non-display area NDA. As an example, the signal transmission line STL may extend from the hole area HA to the non-display area NDA via the display area DA. In the display area DA, the signal transmission line STL may be disposed to be spaced apart from the pixels PX. The signal transmission line STL may be electrically insulated from the pixels PX, and may not exert an influence on the driving of the pixels PX.

In FIG. 4, the signal transmission line STL extends parallel to or substantially parallel to one direction, but the shape of the signal transmission line STL is not particularly limited, as long as the signal transmission line STL extends to be spaced apart from the pixels PX in the display area DA. As an example, the signal transmission line STL may include a bending portion when viewed in the plane (e.g., in a plan view) to be disposed to be spaced apart from the pixels PX.

In the manufacturing process of the display panel DP, the heating line HTL may be used to remove a portion of a common control layer EL (e.g., refer to FIG. 5A) described in more detail below. In other words, the heating line HTL may be formed in the hole area HA to correspond to an area where the common control layer EL (e.g., refer to FIG. 5A) is removed.

The heating line HTL may have a suitable wiring resistance (e.g., a predetermined wiring resistance), and when a current flows through the heating line HTL, heat may be generated by the wiring resistance. Due to the heat generated from the heating line HTL, the common control layer EL (e.g., refer to FIG. 5A) may be removed from the area corresponding to the area in which the heating line HTL is disposed. Accordingly, a continuity of the common control layer EL (e.g., refer to FIG. 5A) may be blocked in the hole area HA. As the continuity of the common control layer EL is blocked in the hole area HA, a foreign substance, moisture, and/or oxygen from the outside of the hole HH may be prevented or substantially prevented from entering the display area DA via the common control layer EL.

The signal transmission line STL may receive a voltage from the outside, and may supply the voltage to the heating line HTL, so that the current flows through the heating line HTL and heat is generated. Because it may be difficult to electrically connect the heating line HTL, which is covered by a preliminary common control layer EL-P (e.g., refer to FIG. 11B), to a power supply device before removing the common control layer EL, a point to which the power supply device is connected may be provided by extending the signal transmission line STL from the heating line HTL to an area in which the common control layer EL is not deposited. In other words, a portion of the signal transmission line STL may be spaced apart from the common control layer EL, and may be exposed to the outside in the non-display area NDA, and thus, the signal transmission line STL may be electrically connected to the power supply device via the exposed portion thereof.

Each of the heating line HTL and the signal transmission line STL may include a conductive material. Each of the heating line HTL and the signal transmission line STL may include a suitable material that may be formed in the form of a wire.

The heating line HTL and the signal transmission line STL may have the same material as each other. The heating line HTL and the signal transmission line STL may be concurrently or substantially simultaneously formed with each other through the same process, but the present disclosure is not limited thereto or thereby. According to an embodiment, the heating line HTL and the signal transmission line STL may include different materials from each other. As an example, the heating line HTL may include a material with a higher wire resistance than that of the signal transmission line STL.

The heating line HTL may include a material with a high thermal conductivity and a high melting point. As an example, the heating line HTL may include a metal material, such as molybdenum (Mo), copper (Cu), tungsten (W), gold (Au), or silver (Ag), or a metal oxide, such as indium tin oxide (ITO), indium zinc oxide (IZO), or indium tin gallium oxide (ITGO). Because the heating line HTL includes the material with high thermal conductivity, heat may be easily transferred to the common control layer EL in the process of removing the common control layer EL. In addition, because the heating line HTL includes the material with the high melting point, the heating line HTL may not be damaged even though a temperature increases due to the heat. The material included in the heating line HTL is not particularly limited, as long as the material is able to be manufactured as wirings and capable of generating heat (e.g., predetermined heat) by a current.

The heating line HTL and the signal transmission line STL may have different line widths from each other. The line widths of the heating line HTL and the signal transmission line STL may be controlled to generate a difference in a wiring resistance between the heating line HTL and the signal transmission line STL. Although the heating line HTL and the signal transmission line STL receive the same voltage, high heat may be selectively generated in the heating line HTL by using the difference in the wiring resistance.

The heating line HTL may have a first line width W1, and the signal transmission line STL may have a second line width W2 greater than the first line width W1. As an example, the second line width W2 may be two times greater than the first line width W1, however, the present disclosure is not limited thereto or thereby.

The first line width W1 may have a size of about several micrometers. As an example, the first line width W1 may be equal to or smaller than about 10 micrometers (μm). However, the size of the first line width W1 is not limited thereto or thereby, as long as the first line width W1 generates the heat due to the wiring resistance.

The second line width W2 of the signal transmission line STL may be equal to or smaller than a distance between pixel electrodes included in the pixels PX. As an example, the second line width W2 may be equal to or smaller than about 20 micrometers (μm). However, the second line width W2 of the signal transmission line STL is not limited thereto or thereby, as long as the signal transmission line STL has the line width greater than that of the heating line HTL, and is disposed to be spaced apart from the pixel electrodes.

Because the heating line HTL has the first line width W1 smaller than the second line width W2 of the signal transmission line STL, the heat desired to remove the common control layer EL may be generated in response to the current supplied thereto from the signal transmission line STL. Because the signal transmission line STL has the second line width W2 greater than the first line width W1 of the heating line HTL, the wiring resistance of the signal transmission line STL may be relatively low, and the current may be easily transferred to the heating line HTL.

Figure 5A:
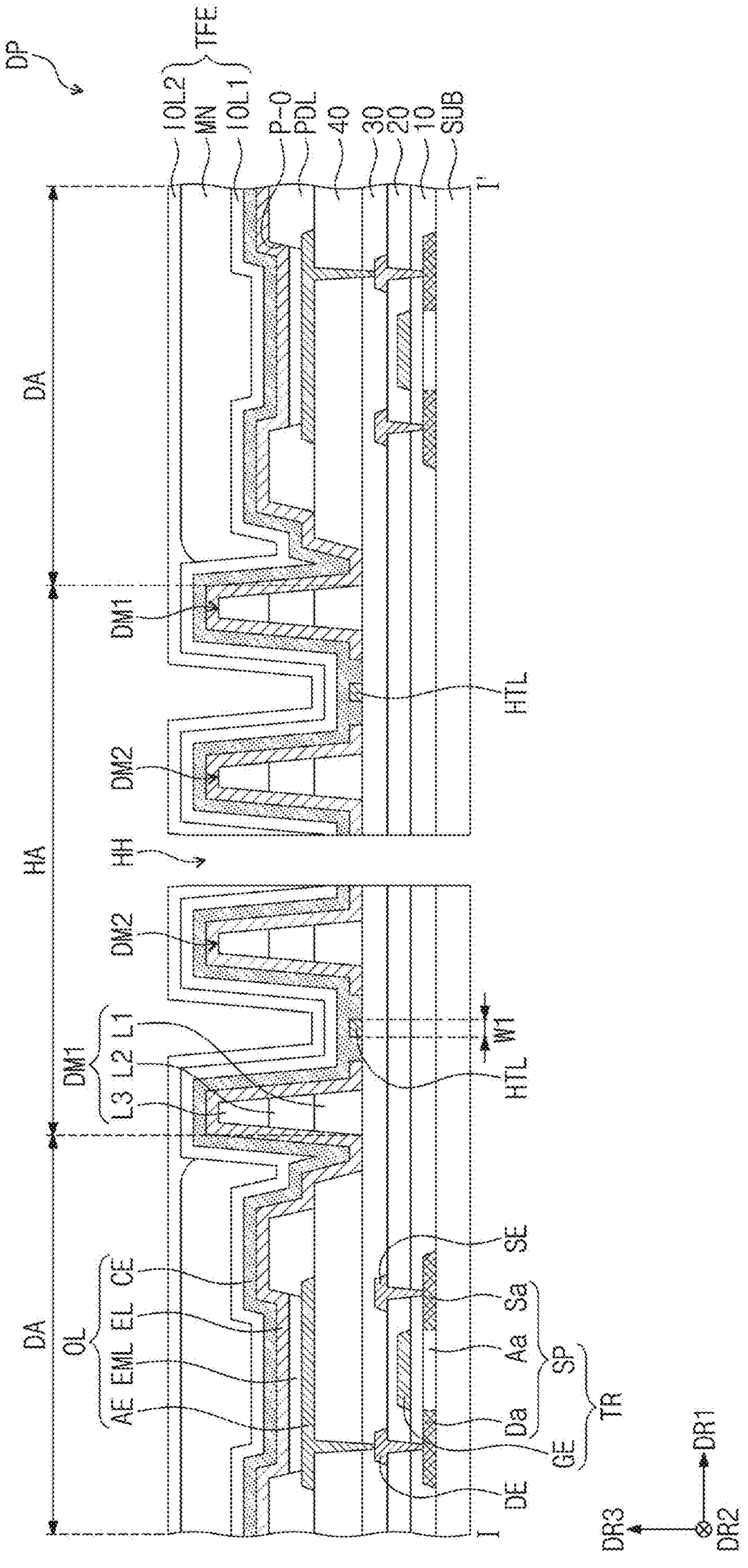
FIGS. 5A and 5B are cross-sectional views of a display panel taken along the line I-I' of FIG. 4.
Figure 5B:
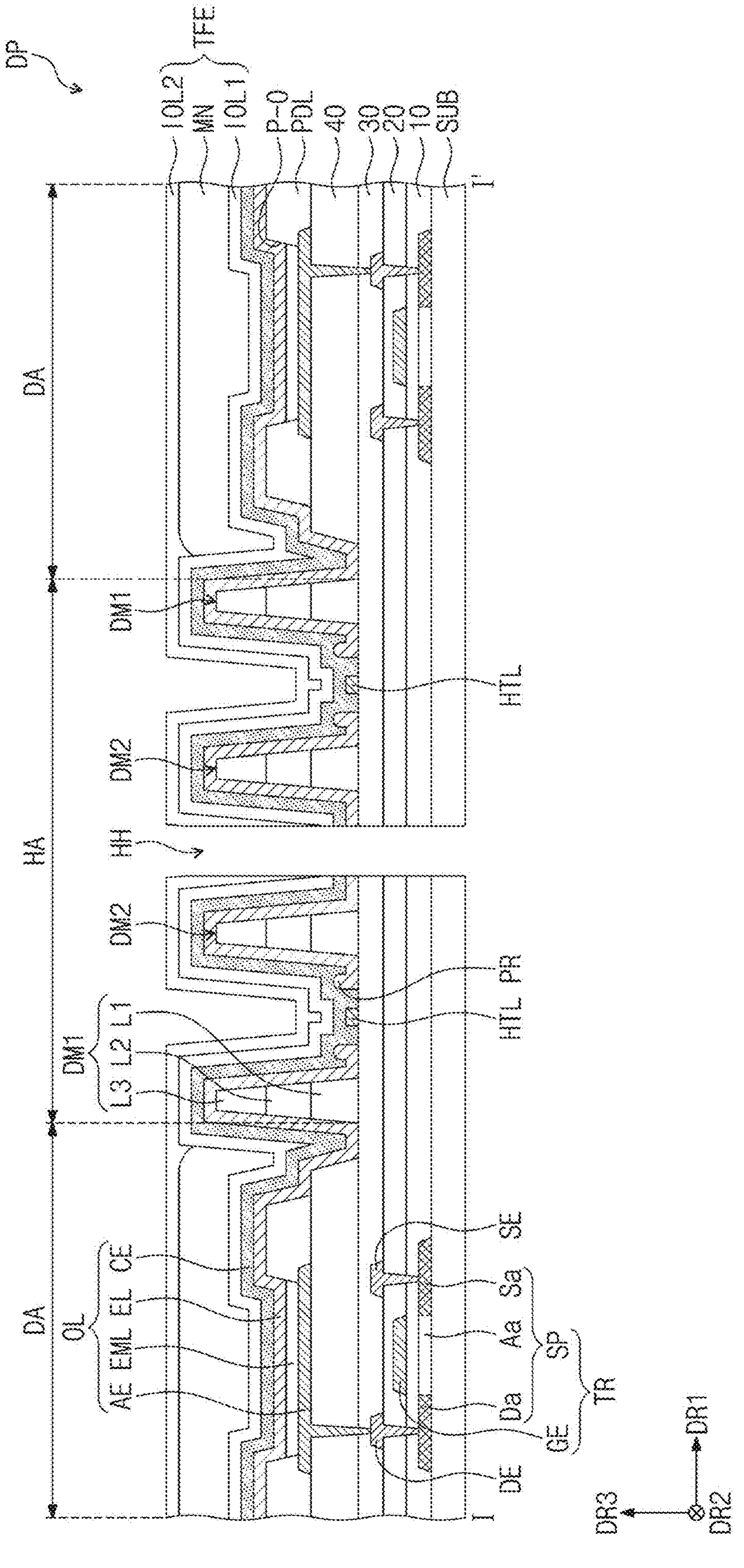

FIGS. 5A and 5B are cross-sectional views of a display panel DP taken along the line I-I' of FIG. 4. Redundant description with those described above may not be repeated hereinafter with reference to FIGS. 5A and 5B.

Referring to FIG. 5A, the display panel DP may include a base substrate SUB, a transistor TR, a light emitting element OL, a plurality of insulating layers 10 to 40 (e.g., 10, 20, 30, and 40), a pixel definition layer PDL, and an encapsulation layer TFE. The transistor TR and the light emitting element OL, which is electrically connected to the transistor TR, may form the pixel PX (e.g., refer to FIG. 4).

The base substrate SUB may be a rigid substrate, however, the present disclosure is not limited thereto. According to an embodiment, the base substrate SUB may be a flexible substrate that is foldable, rollable, or bendable. The base substrate SUB may include a glass substrate, a metal substrate, a polymer substrate, or an organic/inorganic composite material substrate. The base substrate SUB may include a synthetic resin layer. As an example, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, or a polyimide-based resin. However, the materials that may be used for the base substrate SUB are not limited thereto or thereby.

The transistor TR and the insulating layers 10 to 40 may be disposed on the base substrate SUB. The transistor TR and the insulating layers 10 to 40 may be formed by forming an insulating layer, a semiconductor layer, and a conductive layer on the base substrate SUB by a coating or depositing process, and selectively patterning the insulating layer, the semiconductor layer, and the conductive layer through several photolithography processes.

The insulating layers 10 to 40 may include first, second, third, and fourth insulating layers 10, 20, 30, and 40. The first to fourth insulating layers 10 to 40 may include an inorganic layer or an organic layer. As an example, the inorganic layer may include at least one of aluminum oxide, titanium oxide, silicon oxide, silicon nitride, silicon oxynitride, zirconium oxide, or hafnium oxide. The organic layer may include a phenolic-based polymer, an acrylic-based polymer, an imide-based polymer, an aryl ether-based polymer, an amide-based polymer, a fluorine-based polymer, a p-xylene-based polymer, a vinyl alcohol-based polymer, or suitable blends thereof. However, the material for the first to fourth insulating layers 10 to 40 is not limited thereto or thereby. The structure of the insulating layers stacked on the base substrate SUB is not limited thereto or thereby.

The transistor TR may include a semiconductor pattern SP and a gate electrode GE. The semiconductor pattern SP may be disposed on the base substrate SUB. According to an embodiment, a buffer layer may be further disposed between the semiconductor pattern SP and the base substrate SUB, and a bonding force between the semiconductor pattern SP and the base substrate SUB may be improved by the buffer layer.

The semiconductor pattern SP may include a silicon semiconductor. As an example, the semiconductor pattern SP may include a crystalline silicon semiconductor, a polysilicon semiconductor, or an amorphous silicon semiconductor, but the present disclosure is not limited thereto. The semiconductor pattern SP may include an oxide semiconductor. The semiconductor pattern SP may include a variety of suitable materials, as long as the semiconductor pattern SP has a semiconductor property, and thus, it is not particularly limited.

The semiconductor pattern SP may include a source area Sa, a drain area Da, and a channel area Aa. The semiconductor pattern SP may include a plurality of areas distinguished from each other depending on a conductivity. As an example, the semiconductor pattern SP may have different electrical properties depending on whether it is doped or not, whether it is doped with an N-type dopant or a P-type dopant, or whether a metal oxide is reduced or not. A portion of the semiconductor pattern, which has a relatively high conductivity, may serve as an electrode or a signal line, and may correspond to the source area Sa and/or the drain area Da of the transistor TR. A non-doped or non-reduced portion with a relatively lower conductivity may correspond to the channel area Aa (or an active area) of the transistor TR.

The first insulating layer 10 may be disposed on the base substrate SUB, and may cover the semiconductor pattern SP of the transistor TR. The first insulating layer 10 may include an inorganic layer having a single-layer or multiple-layered structure.

The gate electrode GE may be disposed on the first insulating layer 10. The gate electrode GE may overlap with the channel area Aa when viewed in the plane (e.g., in a plan view). The gate electrode GE may serve as a mask in a process of doping the semiconductor pattern SP.

The second insulating layer 20 may be disposed on the first insulating layer 10, and may cover the gate electrode GE. The second insulating layer 20 may include an inorganic layer having a single-layer or multiple-layered structure.

A source electrode SE and a drain electrode DE may be disposed on the second insulating layer 20. The source electrode SE may be connected to the source area Sa of the semiconductor pattern SP via a contact hole defined through (e.g., penetrating) the first and second insulating layers 10 and 20. The drain electrode DE may be connected to the drain area Da of the semiconductor pattern SP via a contact hole defined through (e.g., penetrating) the first and second insulating layers 10 and 20. The source electrode SE and the drain electrode DE may be disposed to be spaced apart from each other on the second insulating layer 20.

The third insulating layer 30 may be disposed on the second insulating layer 20, and may cover the source electrode SE and the drain electrode DE. The fourth insulating layer 40 may be disposed on the third insulating layer 30.

According to an embodiment, the fourth insulating layer 40 may include an organic layer. The fourth insulating layer 40 including the organic layer may cover particles existing on a surface of the third insulating layer 30 and/or a step difference between components disposed thereunder, and may provide a flat or substantially flat surface. In addition, the fourth insulating layer 40 may relieve a stress between the components disposed thereover and thereunder.

The light emitting element OL may be disposed in the display area DA. The light emitting element OL may be disposed on the fourth insulating layer 40. The light emitting element OL may include an organic light emitting element, a quantum dot light emitting element, a micro-LED light emitting element, or a nano-LED light emitting element. According to an embodiment, the light emitting element OL may include various suitable embodiments, as long as light is generated and/or an amount of the light is controlled according to an electrical signal.

The light emitting element OL may include a pixel electrode AE, a light emitting layer EML, the common control layer EL, and a common electrode CE. According to an embodiment, the pixel electrode AE may be an anode electrode, and the common electrode CE may be a cathode electrode.

The pixel electrode AE may be disposed on the fourth insulating layer 40. The pixel electrode AE may be electrically connected to the drain electrode DE via a contact hole defined through (e.g., penetrating) the third insulating layer 30 and the fourth insulating layer 40. In some embodiments, a connection electrode may be further disposed between the light emitting element OL and the drain electrode DE, and the light emitting element OL may be electrically connected to the drain electrode DE through the connection electrode.

The pixel definition layer PDL may be disposed on the fourth insulating layer 40. The pixel definition layer PDL may be provided with a light emitting opening P-O defined therethrough to expose at least a portion of the pixel electrode AE. The portion of the pixel electrode AE, which is exposed through the light emitting opening P-O, may correspond to a light emitting area.

The pixel definition layer PDL may include a polymer resin. As an example, the pixel definition layer PDL may include a polyacrylate-based resin or a polyimide-based resin. The pixel definition layer PDL may include an inorganic material, or may further include the inorganic material in addition to the polymer resin. As an example, the pixel definition layer PDL may include silicon nitride ($SiN_x$), silicon oxide ($SiO_x$), or silicon oxynitride ($SiO_xN_y$).

The pixel definition layer PDL may include a light absorbing material. The pixel definition layer PDL may include a black coloring agent. The black coloring agent may include a black pigment or a black dye. The black coloring agent may include a metal material, such as chrome, a metal oxide, or carbon black. However, the pixel definition layer PDL is not limited thereto or thereby.

The light emitting layer EML may be disposed on the pixel electrode AE. The light emitting layer EML may be disposed in an area corresponding to the light emitting opening P-O. In other words, the light emitting opening P-O may be provided in a plurality, the plurality of light emitting openings P-O may be spaced apart from each other in the pixel definition layer PDL, and a corresponding light emitting layer EML of the pixels PX (e.g., refer to FIG. 4) may be provided to each of the light emitting openings P-O in the form of light emitting patterns that are spaced apart (e.g., separated) from each other when viewed in the plane (e.g., in a plan view). However, the light emitting layer EML is not limited thereto or thereby.

The light emitting layer EML may provide light with a desired color (e.g., a predetermined color). The light emitting layer EML may emit light having at least one of red, green, or blue colors, but the present disclosure is not limited thereto. The light emitting layer EML may generate white light by a combination of light emitting materials respectively generating the red, green, and blue colors.

The light emitting layer EML may include an organic light emitting material and/or an inorganic light emitting material. As an example, the light emitting layer EML may include a fluorescent material, a phosphorescent material, an organometallic complex light emitting material, or a quantum dot. The light emitting layer EML may have a multiple-layered structure. As an example, the light emitting layer EML may include a main light emitting layer, and an auxiliary light emitting layer disposed on the main light emitting layer. The main light emitting layer and the auxiliary light emitting layer may have different thicknesses from each other depending on a wavelength of the light emitted from the light emitting layer EML, and a resonance distance of the light emitting element OL may be controlled by providing the auxiliary light emitting layer. In addition, because the auxiliary light emitting layer may be provided, a color purity of the light emitted from the light emitting layer EML may be improved.

The common control layer EL may be disposed adjacent to the light emitting layer EML between the pixel electrode AE and the common electrode CE. FIG. 5A shows a structure in which the common control layer EL is disposed between the light emitting layer EML and the common electrode CE as a representative example, but the present disclosure is not limited thereto or thereby. According to an embodiment, the common control layer EL may be disposed between the pixel electrode AE and the light emitting layer EML, or the common control layer EL may be provided in a plurality to be disposed over and under the light emitting layer EML. As an example, the common control layer EL may include at least one of a hole control layer or an electron control layer.

The common control layer EL may be commonly disposed over the pixels PX (e.g., refer to FIG. 4). The common control layer EL may be disposed on an upper surface of the pixel definition layer PDL. The common control layer EL may extend from the display area DA, and may be disposed in the hole area HA. A continuity of the common control layer EL may be blocked in an area in which the heating line HTL is disposed. As an example, the heating line HTL may be disposed in the hole area HA, and the common control layer EL may be disposed to be spaced apart from the heating line HTL in the hole area HA. Accordingly, the continuity of the common control layer EL may be blocked in the hole area HA. Because the continuity of the common control layer EL is blocked, foreign substances, moisture, and oxygen from the outside of the hole HH may be prevented or substantially prevented from entering the display area DA through the common control layer EL.

The common electrode CE may be disposed on the light emitting layer EML. The common electrode CE may be commonly disposed over the pixels PX to provide a common voltage. The common electrode CE may extend from the display area DA, and may be disposed to overlap with the hole area HA.

A first voltage may be applied to the pixel electrode AE via the transistor TR, and the common voltage may be applied to the common electrode CE via a signal line for applying the common voltage. Holes and electrons, which are injected into the light emitting layer EML, may be recombined with each other to generate excitons, and the light emitting element OL may emit light through the display area DA when the excitons return to a ground state from an excited state.

Each of the pixel electrode AE and the common electrode CE may be a transmissive electrode, a transflective electrode, or a reflective electrode. The transmissive electrode may include a transparent metal oxide, for example, such as indium tin oxide (ITO), indium zinc oxide (IZO), zinc oxide (ZnO), indium tin zinc oxide (ITZO), or the like. The transflective electrode or the reflective electrode may include silver (Ag), magnesium (Mg), copper (Cu), aluminum (Al), platinum (Pt), palladium (Pd), nickel (Ni), neodymium (Nd), iridium (Ir), chromium (Cr), lithium (Li), potassium (Ca), molybdenum (Mo), titanium (Ti), ytterbium (Yb), tungsten (W), a suitable compound thereof, or a suitable mixture thereof (e.g., AgMg, AgYb, or MgYb).

The encapsulation layer TFE may be disposed on the light emitting element OL, and may encapsulate the light emitting element OL. The encapsulation layer TFE may include at least one insulating layer. The encapsulation layer TFE may include a plurality of inorganic layers IOL1 and IOL2, and at least one organic layer MN disposed between the inorganic layers IOL1 and IOL2. A first inorganic layer IOL1 may be disposed on the common electrode CE. The organic layer MN and a second inorganic layer IOL2 may be sequentially disposed on the first inorganic layer IOL1.

The first inorganic layer IOL1 and the second inorganic layer IOL2 may protect the light emitting element OL from moisture and/or oxygen. The first inorganic layer IOL1 and the second inorganic layer IOL2 may include at least one of aluminum oxide, titanium oxide, silicon oxide, silicon nitride, silicon oxynitride, zirconium oxide, or hafnium oxide. However, the materials for the first inorganic layer IOL1 and the second inorganic layer IOL2 are not limited thereto or thereby.

The organic layer MN may protect the light emitting element OL from a foreign substance, such as dust particles. The organic layer MN may include an acrylic-based resin, but the present disclosure is not limited thereto.

The hole HH may be defined through components of the display panel DP disposed in the hole area HA. The hole HH may be defined through the base substrate SUB, the insulating layers 10 to 40, the common control layer EL, and the inorganic layers IOL1 and IOL2, which are disposed on the base substrate SUB.

The first dam DM1 and the second dam DM2 may be disposed between the hole HH and the display area DA in the hole area HA. Each of the first dam DM1 and the second dam DM2 may have a multi-layered structure. As an example, each of the first dam DM1 and the second dam DM2 may include dam portions L1, L2, and L3 stacked in the third direction DR3. FIG. 5A shows a structure in which each of the first dam DM1 and the second dam DM2 includes the first, second, and third dam portions L1, L2, and L3 as a representative example. However, the stacked structure of the first dam DM1 and the second dam DM2 is not limited thereto or thereby.

The first dam portion L1 may be disposed on the third insulating layer 30. The first dam portion L1 may be formed concurrently or substantially simultaneously with the fourth insulating layer 40 in a process of forming the fourth insulating layer 40. The first dam portion L1 may include the same material as that of the fourth insulating layer 40, but the present disclosure is not limited thereto or thereby.

The second dam portion L2 may be disposed on the first dam portion L1. The second dam portion L2 may be formed concurrently or substantially simultaneously with the pixel definition layer PDL in a process of forming the pixel definition layer PDL. The second dam portion L2 may include the same material as that of the pixel definition layer PDL, but the present disclosure is not limited thereto or thereby.

The third dam portion L3 may be disposed on the second dam portion L2. The third dam portion L3 may be formed by depositing an additional layer after forming the pixel definition layer PDL, but the present disclosure is not limited thereto or thereby. According to an embodiment, the third dam portion L3 may include the same material as that of the second dam portion L2, and the second dam portion L2 and the third dam portion L3 may be concurrently or substantially simultaneously formed with each other, but the present disclosure is not limited thereto or thereby.

The first dam DM1 and the second dam DM2 may have the same or substantially the same height as each other in the third direction DR3, but the present disclosure is not limited thereto or thereby. According to an embodiment, the first dam DM1 and the second dam DM2 may have different heights from each other.

The organic layer MN of the encapsulation layer TFE may extend from the display area DA to the hole area HA, and an area in which the organic layer MN is formed may be defined by at least one of the first dam DM1 or the second dam DM2. At least one of the first dam DM1 or the second dam DM2 may be spaced apart from the organic layer MN. As an example, from among the dams DM1 and DM2, the second dam DM2 disposed relatively adjacent (e.g., relatively closer) to the hole HH may be spaced apart from the organic layer MN.

The organic layer MN may be formed by curing a liquid organic resin, and the dams DM1 and DM2 may prevent or substantially prevent the liquid organic resin from flowing throughout the hole area HA. The dams DM1 and DM2 may block a continuity of the organic layer MN in the hole area HA. As the continuity of the organic layer MN is blocked, a path through which external contaminants may enter the display area DA from the hole area HA may be blocked (e.g., may be easily blocked).

The organic layer MN may be formed to be spaced apart from the hole HH by the dams DM1 and DM2. Accordingly, a cross-section of the organic layer MN may not be exposed through the hole HH, and thus, moisture and/or oxygen introduced through the hole HH may be prevented or substantially prevented from flowing into the organic layer MN. As a result, moisture and/or oxygen may be prevented or substantially prevented from entering the organic layer MN through the hole HH, and thus, from entering the light emitting element OL disposed in the display area DA. Accordingly, a reliability of the display panel DP may be improved.

The first and second inorganic layers IOL1 and IOL2 of the encapsulation layer TFE may extend from the display area DA to the hole area HA. The first inorganic layer IOL1 and the second inorganic layer IOL2 may cover the dams DM1 and DM2, and may be in contact with each other on the dams DM1 and DM2. Accordingly, the first and second inorganic layers IOL1 and IOL2 in the hole area HA may encapsulate the organic layer MN disposed therebetween.

The heating line HTL may be disposed on the third insulating layer 30. The heating line HTL may be disposed on the third insulating layer 30 between the first dam DM1 and the second dam DM2. The heating line HTL may be spaced apart from the fourth insulating layer 40 and the dams DM1 and DM2. However, the position of the heating line HTL is not particularly limited thereto, as long as the heating line HTL is disposed adjacent to the hole HH, and the upper surface of the heating line HTL is exposed without being covered by the insulating layer.

The continuity of the common control layer EL may be blocked by the heating line HTL. An area from which the common control layer EL is removed may correspond to the area in which the heating line HTL is disposed. The common control layer EL may be sublimated or vaporized by the heat generated from the heating line HTL, and may be removed. Accordingly, the common control layer EL may include portions that are spaced apart from each other with the heating line HTL interposed therebetween in the hole area HA. The common electrode CE, the first inorganic layer IOL1, and the second inorganic layer IOL2 may be disposed on the heating line HTL that is exposed without being covered by the common control layer EL.

The heating line HTL may be formed concurrently or substantially simultaneously with the pixel electrode AE in a process of forming the pixel electrode AE. The heating line HTL may include the same material as that of the pixel electrode AE. The heating line HTL may have the same or substantially the same stacked structure as that of the pixel electrode AE. As an example, the pixel electrode AE may have a three-layered structure of ITO/Ag/ITO, and the heating line HTL may have the same three-layered structure. Because the heating line HTL may be formed in the process of forming the pixel electrode AE, additional processes used to form the heating line HTL may be omitted.

However, the present disclosure is not limited thereto or thereby, and the heating line HTL may be formed through a process separate from that of the pixel electrode AE.

Because the heating line HTL may be formed through the separate process from that of the pixel electrode AE, the heating line HTL may be formed of a conductive material different from that of the pixel electrode AE. In other words, because the heating line HTL may be formed through the separate process, the heating line HTL may be designed to include one or more materials that are appropriate to remove the common control layer EL, and the material for the heating line HTL may not be specifically limited.

Referring to FIG. 5B, in some embodiments, the common control layer EL may further include a protruding portion PR. The protruding portion PR may be formed to be adjacent to an inner side surface of the common control layer EL that is adjacent to the heating line HTL. The protruding portion PR may be disposed to be adjacent to one end of the common control layer EL, which faces the heating line HTL. In a process of removing a portion of the common control layer EL by the heat generated from the heating line HTL, a material for the common control layer EL may be extruded out of the heating line HTL, and thus, the protruding portion PR may be formed adjacent to the removed portion of the common control layer EL. A thickness of the common control layer EL where the protruding portion PR is formed may be greater than a thickness of the common control layer EL where the protruding portion PR is not formed.

In some embodiments, the display panel DP may further include a structure in the hole area HA to block a continuity of the common control layer EL. As an example, the display panel DP may have an undercut structure, a reverse tapered structure, or a groove structure defined in the hole area HA, and thus, the display panel DP together with the heating line HTL may block the continuity of the common control layer EL.

Figure 6A:
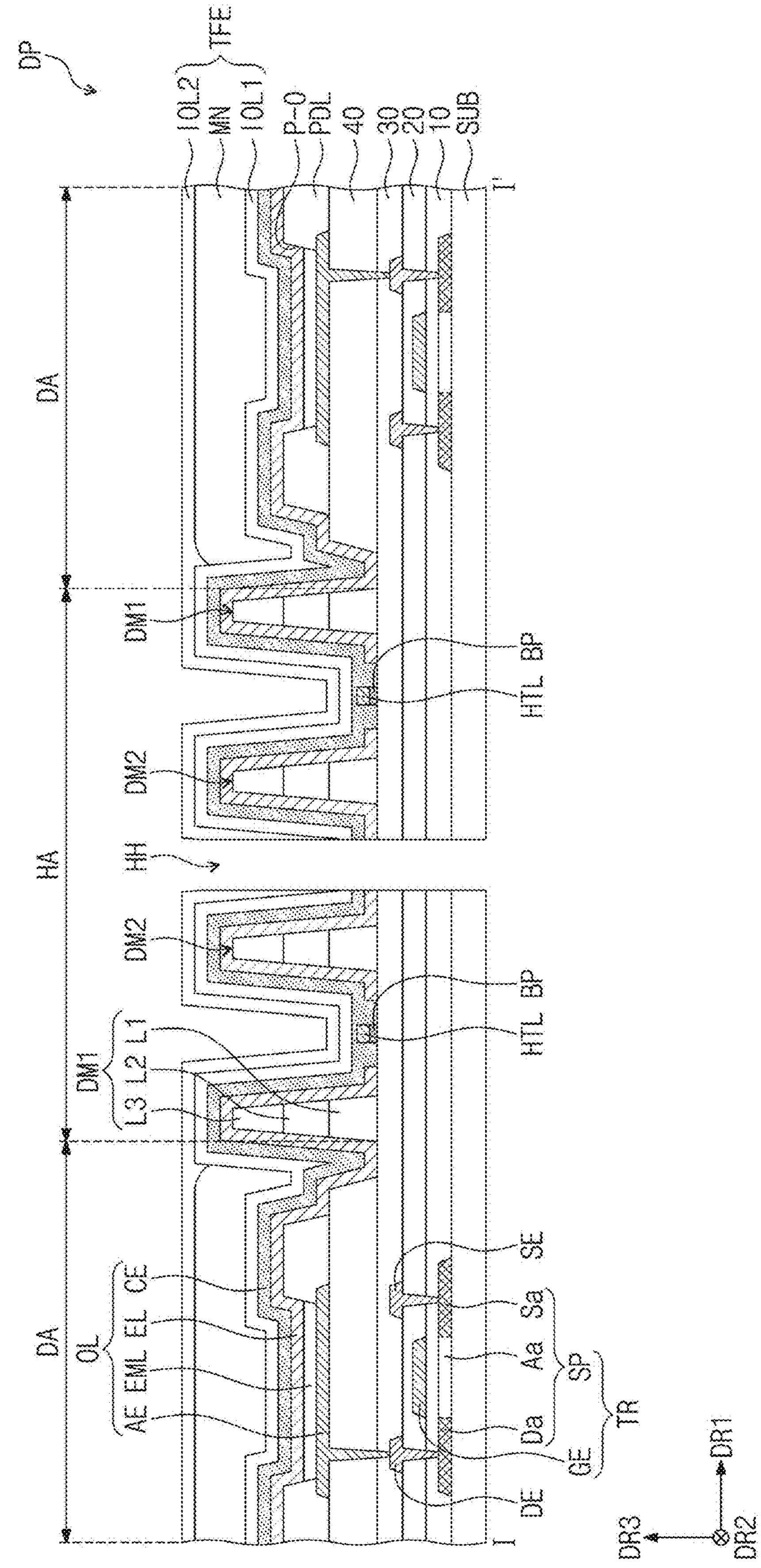
FIGS. 6A and 6B are cross-sectional views of a display panel taken along the line I-I' of FIG. 4.
Figure 6B:
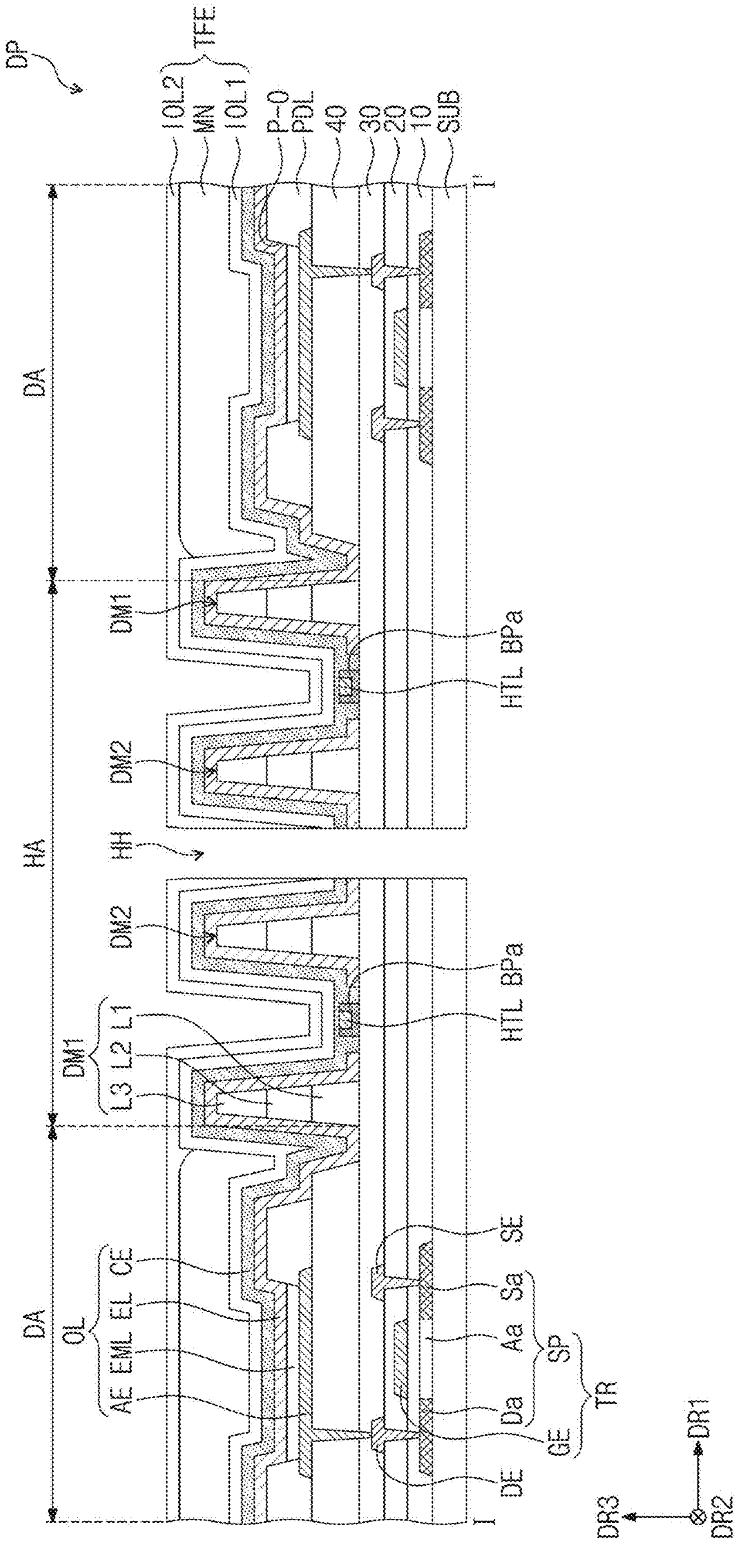

FIGS. 6A and 6B are cross-sectional views of a display panel DP taken along the line I-I' of FIG. 4. Hereinafter, redundant description of the elements illustrated in FIGS. 6A and 6B that are the same or substantially the same as the elements described above may not be repeated.

Referring to FIG. 6A, in some embodiments, the display panel DP may further include a barrier portion BP disposed under the heating line HTL. The barrier portion BP may have a shape corresponding to a shape of the heating line HLT when viewed in the plane (e.g., in a plan view). The barrier portion BP may be in contact with a rear surface of the heating line HTL. The barrier portion BP may be formed through a separate deposition process before the heating line HTL is formed.

The barrier portion BP may include a suitable material having a thermal conductivity lower than that of the heating line HTL. As an example, the barrier portion BP may include an inorganic material, such as titanium (Ti), lead (Pb), or aluminum oxide (AlOx), an organic material, such as polyimide (PI), or an inorganic material, such as silicon oxide (SiOx) or silicon nitride (SiNx).

The barrier portion BP may be disposed under the heating line HTL, and may reduce a transfer of the heat generated by the heating line HTL to other components of the display panel DP, except to a portion of the common control layer EL that is to be removed when the heating line HTL generates the heat. In other words, the barrier portion BP may prevent or substantially prevent the display panel DP from being damaged due to the heat generated from the heating line HTL, and may protect the display panel DP.

A side surface of the heating line HTL may be exposed without being covered by the barrier portion BP. As an example, a side surface of the barrier portion BP may be aligned with the side surface of the heating line HLT, but the present disclosure is not limited thereto or thereby.

Referring to FIG. 6B, in some embodiments, a barrier portion BPa may cover the rear surface and at least a portion of the side surface of the heating line HTL. The barrier portion BPa may be in contact with the rear surface and the side surface of the heating line HTL. A structure of the barrier portions BP and BPa is not particularly limited, as long as a portion of the common control layer EL is removed by the heating line HTL and the display panel DP is protected.

Figure 7A:
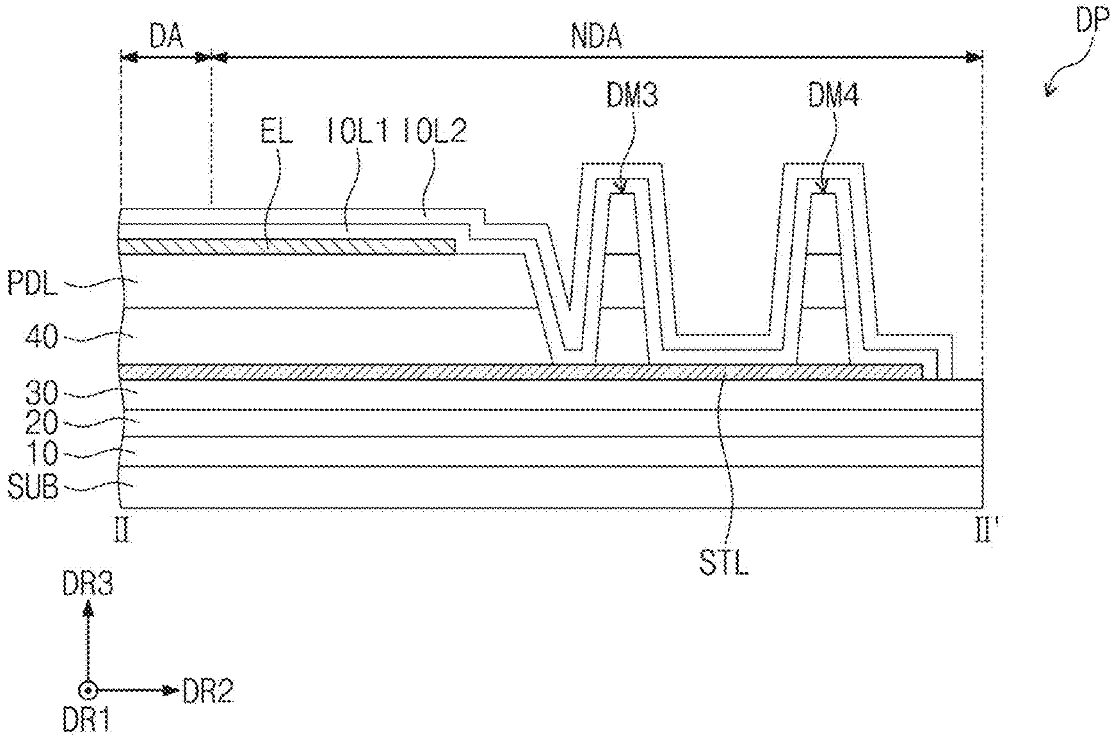
FIGS. 7A and 7B are cross-sectional views of a display panel taken along the line II-II' of FIG. 4.
Figure 7B:
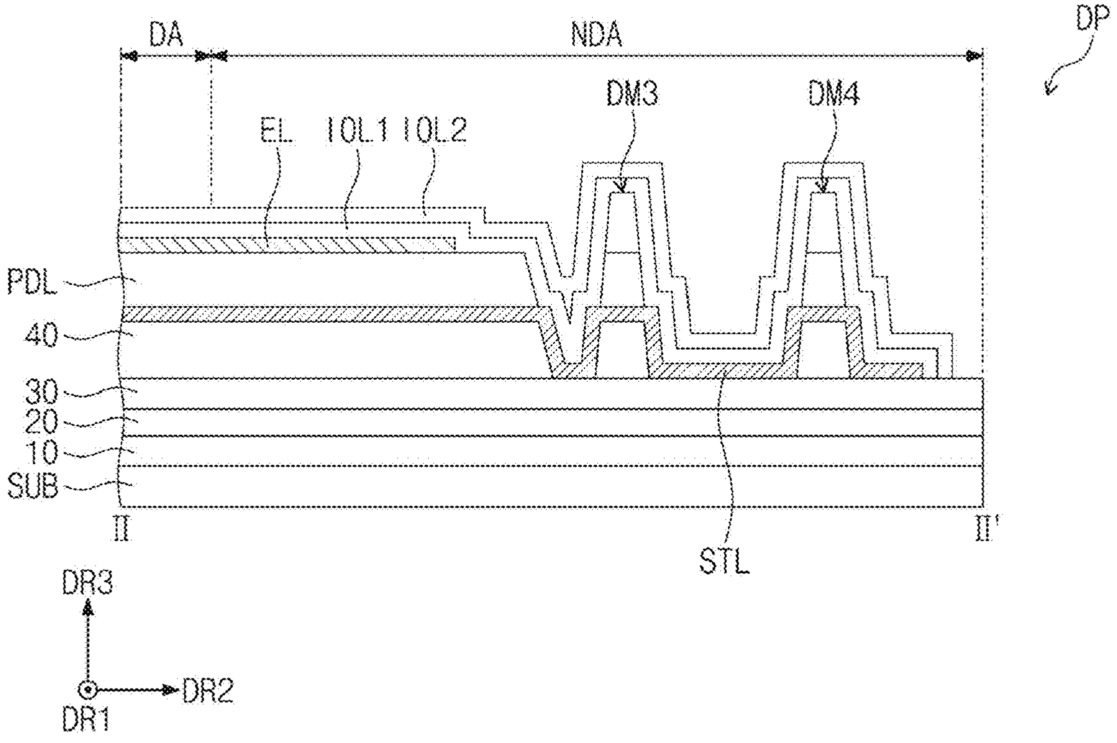

FIGS. 7A and 7B are cross-sectional views of a display panel DP taken along the line II-II' of FIG. 4. Hereinafter, redundant description of the elements illustrated in FIGS. 7A and 7B that are the same or substantially the same as the elements described above may not be repeated.

Referring to FIGS. 7A and 7B, in some embodiments, the display panel DP may further include at least one dam DM3 or DM4 disposed in the non-display area NDA. FIGS. 7A and 7B show a third dam DM3 and a fourth dam DM4, which are disposed in the non-display area NDA.

The third dam DM3 and the fourth dam DM4 may be disposed outside the display area DA. As an example, the third dam DM3 and the fourth dam DM4 may be disposed to surround (e.g., around a periphery of) the display area DA when viewed in the plane (e.g., in a plan view).

Each of the third dam DM3 and the fourth dam DM4 may have the same or substantially the same stacked structure as that of the first dam DM1 (e.g., refer to FIG. 5A). The third dam DM3 and the fourth dam DM4 may be formed through the same process as that of the first dam DM1 (e.g., refer to FIG. 5A), but the present disclosure is not limited thereto or thereby.

Referring to FIGS. 4, 7A, and 7B, the signal transmission line STL may be connected to the heating line HTL, and may extend to the non-display area NDA via the display area DA. An end of the signal transmission line STL may be disposed in the non-display area NDA.

Unlike the heating line HTL that is exposed without being covered by the fourth insulating layer 40 and the pixel definition layer PDL, at least a portion of the signal transmission line STL may overlap with the fourth insulating layer 40 and the pixel definition layer PDL. Because the common control layer EL is removed from an area corresponding to the heating line HTL, the heating line HTL may not overlap with the common control layer EL, but the portion of the signal transmission line STL may overlap with the common control layer EL.

The end of the signal transmission line STL may not overlap with the common control layer EL. In other words, the end of the signal transmission line STL may not overlap with the common control layer EL, and may be exposed without being covered by the common control layer EL in the process of depositing the common control layer EL. Because the end of the signal transmission line STL is exposed without being covered by the common control layer EL, a point to which the power supply device is connected may be provided so that the heating line HTL generates the heat.

As shown in FIG. 7A, in some embodiments, the signal transmission line STL may be disposed on the third insulating layer 30. The signal transmission line STL may be formed in a process different from the process of forming the pixel electrode AE (e.g., refer to FIG. 5A). The signal transmission line STL may be disposed at (e.g., in or on) a different layer from that of the pixel electrode AE. When the heating line HTL is formed in the different process from the process of forming the pixel electrode AE, the signal transmission line STL that is concurrently or substantially simultaneously formed with the heating line HTL may also be formed in the different process from the process of forming the pixel electrode AE. However, the present disclosure is not limited thereto or thereby, as long as the signal transmission line STL is connected to the heating line HTL.

Referring to FIG. 7B, in some embodiments, the signal transmission line STL may be concurrently or substantially simultaneously formed with the pixel electrode AE (e.g., refer to FIG. 5A) through the same process. The signal transmission line STL may be disposed at (e.g., in or on) the same layer as that of the pixel electrode AE. As an example, the signal transmission line STL may be disposed on the fourth insulating layer 40. In the case where the heating line HTL is formed through the same process as that of the pixel electrode AE (e.g., refer to FIG. 5A), the signal transmission line STL that is concurrently or substantially simultaneously formed with the heating line HTL may also be formed with the pixel electrode AE through the same process. However, the present disclosure is not limited thereto or thereby, as long as the signal transmission line STL is connected to the heating line HTL.

Some of the dam portions included in the third dam DM3 and the fourth dam DM4 may be concurrently or substantially simultaneously formed in the same process as forming the fourth insulating layer 40. In this case, the signal transmission line STL may extend to an end of the non-display area NDA via between the dam portions included in the third dam DM3 and the fourth dam DM4, but the present disclosure is not limited thereto.

Figure 8:
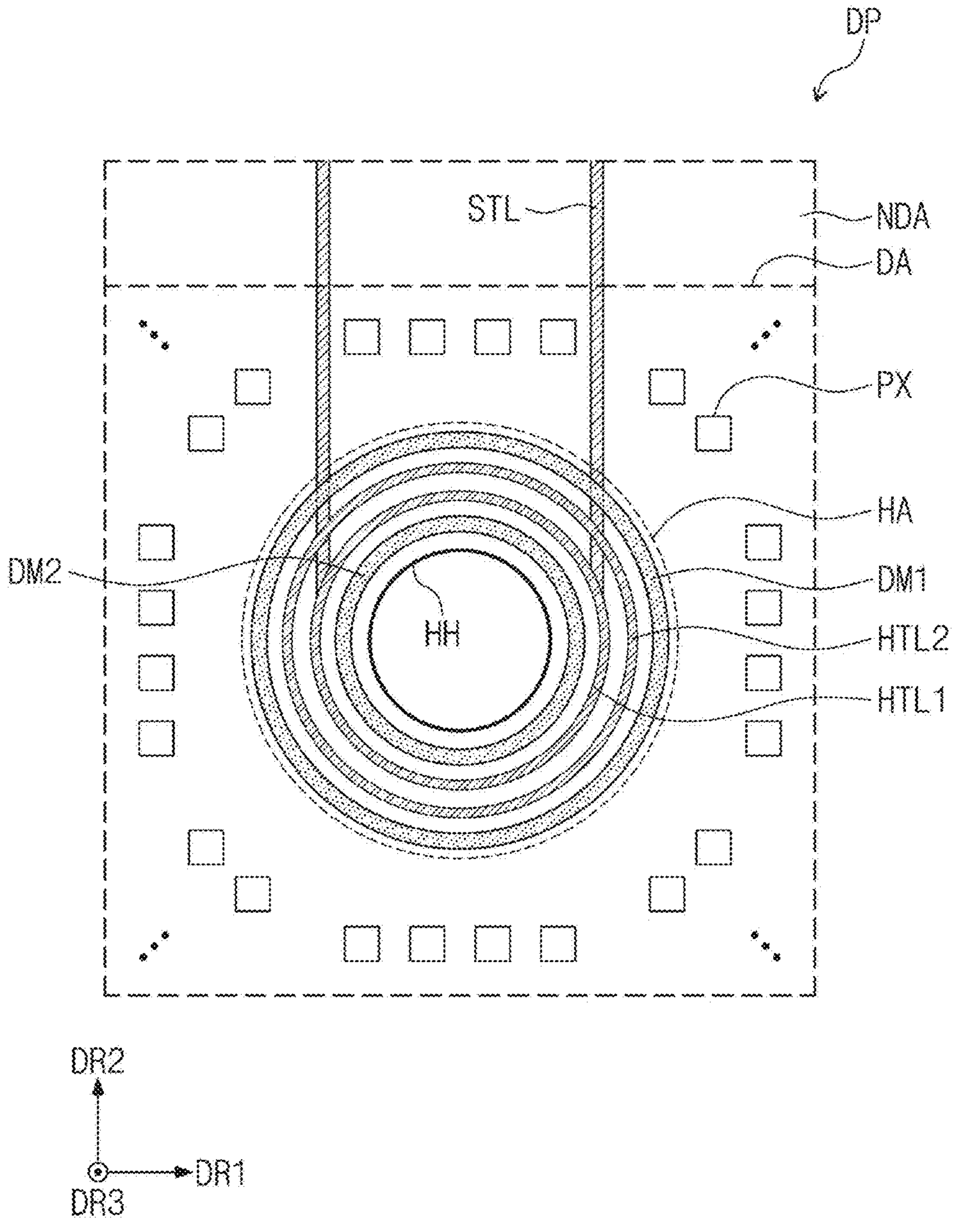
FIG. 8 is an enlarged plan view of an area of a portion of a display panel according to an embodiment of the present disclosure.

FIG. 8 is an enlarged plan view of an area of a portion of a display panel DP according to an embodiment of the present disclosure. FIG. 8 schematically shows some of the components of the display panel DP in the hole area HA, and redundant description of the elements in FIG. 8 that are the same or substantially the same as the elements described above may not be repeated.

Referring to FIG. 8, the display panel DP may include a plurality of heating lines HTL1 and HTL2. As an example, the heating lines HTL1 and HTL2 may include a first heating line HTL1 and a second heating line HTL2. However, the number of the heating lines HTL1 and HTL2 provided in the display panel DP is not limited thereto or thereby.

Each of the first heating line HTL1 and the second heating line HTL2 may be disposed in the hole area HA. As an example, the first heating line HTL1 and the second heating line HTL2 may be disposed between a first dam DM1 and a second dam DM2 when viewed in the plane (e.g., in a plan view). The first heating line HTL1 may be disposed to be closer to the second dam DM2 than (e.g., when compared to) the second heating line HTL2. In other words, the first heating line HTL1 may be disposed between the second dam DM2 and the second heating line HTL2. However, the locations of the first and second heating lines HTL1 and HTL2 are not particularly limited, as long as the first and second heating lines HTL1 and HTL2 are arranged around the hole HH.

The first heating line HTL1 and the second heating line HTL2 may surround (e.g., around a periphery of) the hole HH. The first heating line HTL1 and the second heating line HTL2 may have a closed-loop shape surrounding (e.g., around a periphery of) the hole HH. The first heating line HTL1 and the second heating line HTL2 may have a shape corresponding to an outer line of the hole HH. As an example, the hole HH may have a circular shape when viewed in the plane (e.g., in a plan view), and each of the first heating line HTL1 and the second heating line HTL2 may have a circular ring shape, but the present disclosure is not limited thereto or thereby. According to an embodiment, the first heating line HTL1 and the second heating line HTL2 may have different closed-loop shapes from each other, or the first heating line HTL1 and the second heating line HTL2 may have a shape different from that of the outer line of the hole HH.

A signal transmission line STL may extend from the first heating line HTL1 and the second heating line HTL2. The first heating line HTL1 and the second heating line HTL2 may be connected to the same signal transmission line STL, but the present disclosure is not limited thereto or thereby. According to an embodiment, the signal transmission line STL connected to the first heating line HTL1 and the signal transmission line STL connected to the second heating line HTL2 may be distinguishable from each other.

The first heating line HTL1 and the second heating line HTL2 may include a suitable material having a high thermal conductivity and a high melting point. As an example, the first heating line HTL1 and the second heating line HTL2 may include a metal material, such as molybdenum (Mo), copper (Cu), tungsten (W), gold (Au), or silver (Ag), or a metal oxide, such as indium tin oxide (ITO), indium zinc oxide (IZO), or indium tin gallium oxide (ITGO).

The first heating line HTL1 and the second heating line HTL2 may include the same conductive material as each other. The first heating line HTL1 and the second heating line HTL2 may be concurrently or substantially simultaneously formed with each other through the same process, but the present disclosure is not limited thereto or thereby. According to an embodiment, the first heating line HTL1 and the second heating line HTL2 may include different conductive materials from each other.

The first heating line HTL1 and the second heating line HTL2 may have the same or substantially the same line width as each other, but the present disclosure is not limited thereto or thereby. According to an embodiment, the first heating line HTL1 and the second heating line HTL2 may have different line lengths from each other, and the line width of the first heating line HTL1 and the line width of the second heating line HTL2 may be designed to be different from each other by taking into account the difference in the line lengths between the first heating line HTL1 and the second heating line HTL2.

Each of the first heating line HTL1 and the second heating line HTL2 may have the line width smaller than that of the signal transmission line STL. The line width of each of the heating lines HTL1 and HTL2 and the signal transmission line STL may be variously adjusted as needed or desired to generate a difference in a wiring resistance between the heating lines HTL1 and HTL2 and the signal transmission line STL.

The signal transmission line STL may have the wiring resistance smaller than that of the heating lines HTL1 and HTL2, and the signal transmission line STL may apply (e.g., may easily apply) a current to the heating lines HTL1 and HTL2. The wiring resistance of each of the heating lines HTL1 and HTL2 may be greater than that of the signal transmission line STL, and each of the heating lines HTL1 and HTL2 may generate heat used to remove the common control layer EL (e.g., refer to FIG. 5A) in response to the current applied thereto from the signal transmission line STL.

Figure 9A:
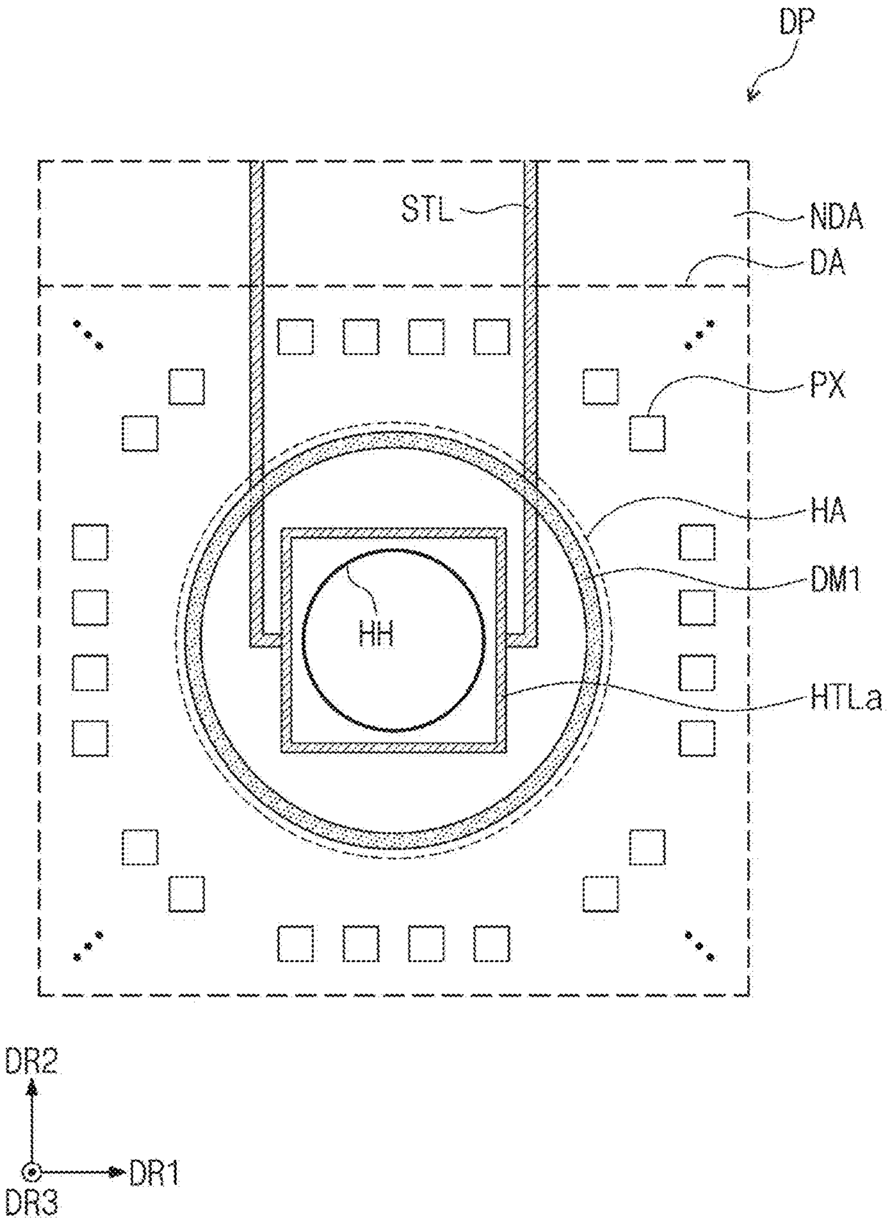
FIGS. 9A and 9B are enlarged plan views of an area of a portion of a display panel according to embodiments of the present disclosure.
Figure 9B:
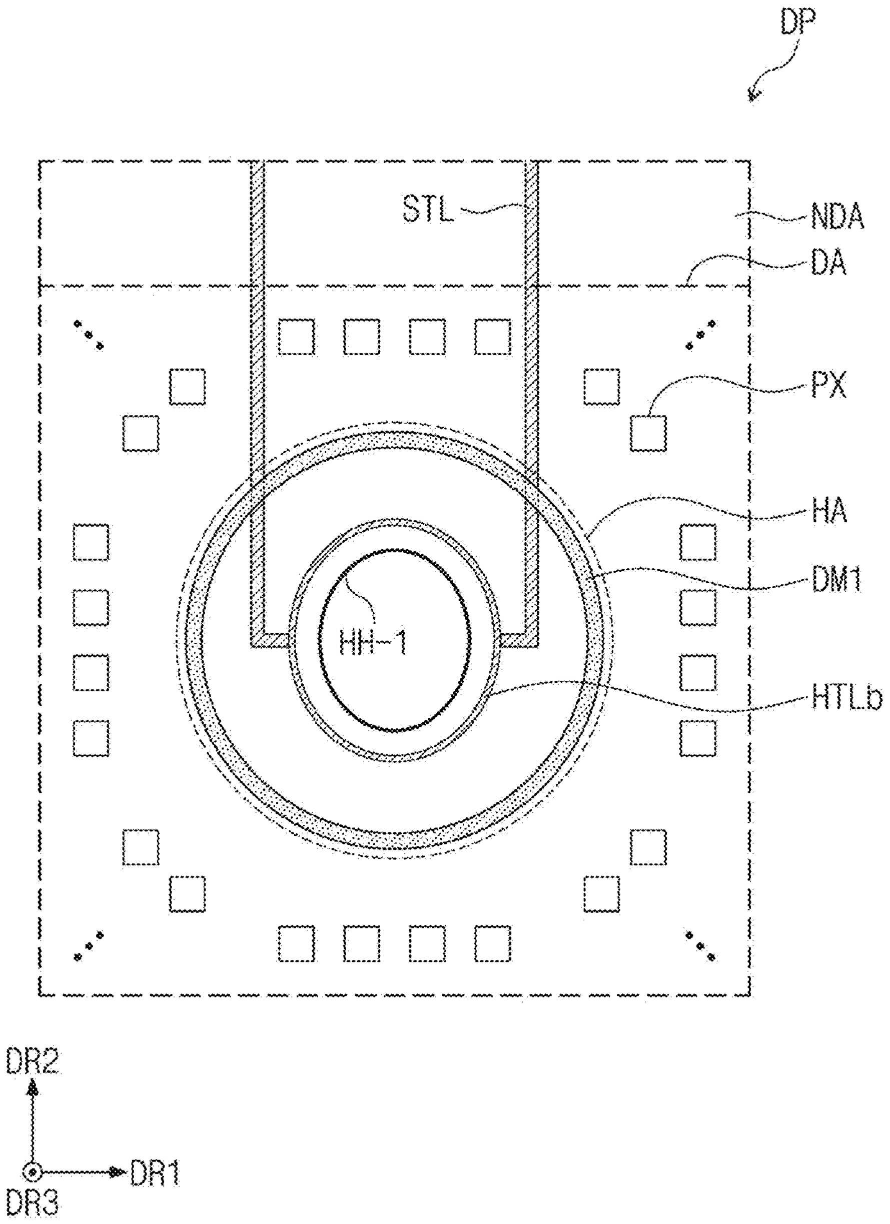

FIGS. 9A and 9B are enlarged plan views of an area of a portion of a display panel DP according to embodiments of the present disclosure. FIGS. 9A and 9B schematically show the components of the display panel DP in the hole area HA, and redundant description of the elements illustrated in FIGS. 9A and 9B that are the same or substantially the same as the elements described above may not be repeated.

FIGS. 9A and 9B show structures in which one first dam DM1 is disposed in the hole area HA, but the present disclosure is not limited thereto or thereby, and a plurality of dams may be disposed in the hole area HA.

Referring to FIG. 9A, a heating line HTLa may be disposed to be closer to the hole HH in the hole area HA than (e.g., compared to) the first dam DM1. The location of the heating line HTLa is not particularly limited, as long as the heating line HTLa is disposed adjacent to and around the hole HH.

The heating line HTLa may surround (e.g., around a periphery of) the hole HH. The heating line HTLa may have a closed-loop shape surrounding (e.g., around a periphery of) the hole HH. The heating line HTLa may have a suitable shape different from the shape corresponding to the outer line of the hole HH. As an example, the hole HH may have a circular shape when viewed in the plane (e.g., in a plan view), and the heating line HTLa may have a quadrangular ring shape. The shape of the heating line HTLa is not particularly limited, as long as the heating line HTLa has the closed-loop shape surrounding (e.g., around a periphery of) the hole HH.

A signal transmission line STL may include a bent portion when viewed in the plane (e.g., in a plan view). As an example, the signal transmission line STL may include a portion extending in the first direction DR1, and a portion extending in the second direction DR2. The signal transmission line STL may have a line width sufficient to apply a current, and thus, the current may be applied to the heating line HTLa without concentration of heat at the bent portion. The shape of the signal transmission line STL in the plane (e.g., in a plan view) is not particularly limited, as long as the signal transmission line STL is connected to the heating line HTLa.

A shape of the hole defined in the display panel DP may be variously modified as needed or desired. As an example, referring to FIG. 9B, in some embodiments, a hole HH-1 may have an oval shape, but the present disclosure is not limited thereto. According to an embodiment, the hole HH-1 may have a polygonal shape, such as a quadrangular shape. However, the shape of the hole HH-1 is not particularly limited, as long as the hole HH-1 is defined through the display panel DP.

A heating line HTLb may have the same or substantially the same shape as the shape corresponding to the outer line of the hole HH-1. As an example, the hole HH-1 may have the oval shape when viewed in the plane (e.g., in a plan view), and the heating line HTLb may have an oval ring shape. However, the present disclosure is not limited thereto or thereby, and when the hole HH-1 has a quadrangular shape when viewed in the plane (e.g., in a plan view), the heating line HTLb may have a quadrangular ring shape surrounding (e.g., around a periphery of) the hole HH-1.

A manufacturing method of the display panel according to one or more embodiments of the present disclosure may include a process for providing a preliminary display panel including a pixel electrode, a heating line, and a signal transmission line, a process of forming a preliminary common control layer on the preliminary display panel, a process of applying a pulse voltage to the signal transmission line to generate heat in the heating line, and a process of removing a preliminary common control layer (e.g., a portion thereof) disposed on the heating line using the heat generated from the heating line to form the common control layer.

According to an embodiment, the pixel electrode, the heating line, and the signal transmission line, which are disposed on the preliminary display panel, may be concurrently or substantially simultaneously formed with each other through the same process. This will be described in more detail below with reference to FIGS. 10A through 10C.

Figure 10A:
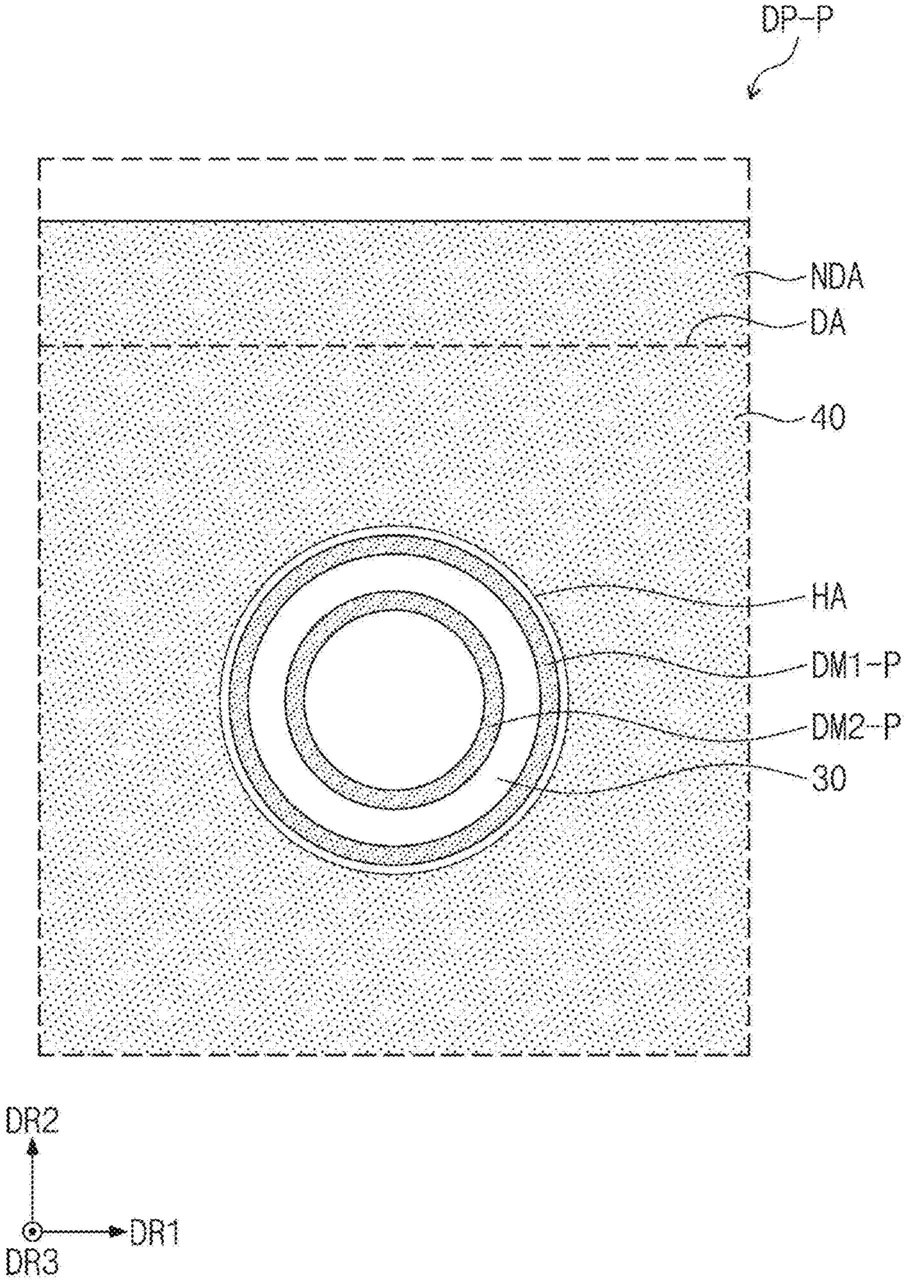
FIGS. 10A through 10C are plan views illustrating a method of manufacturing a display panel according to one or more embodiments of the present disclosure.
Figure 10B:
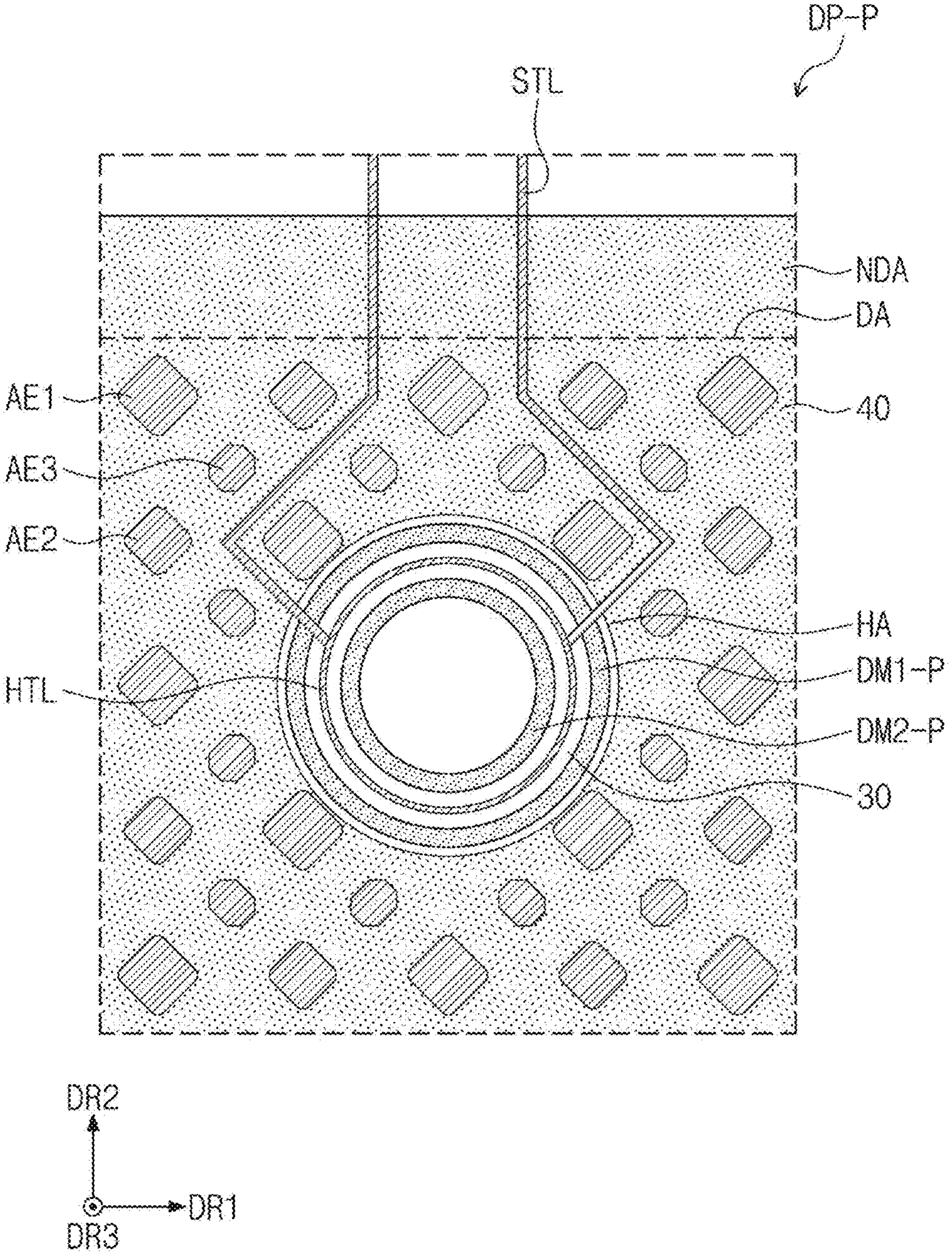
Figure 10C:
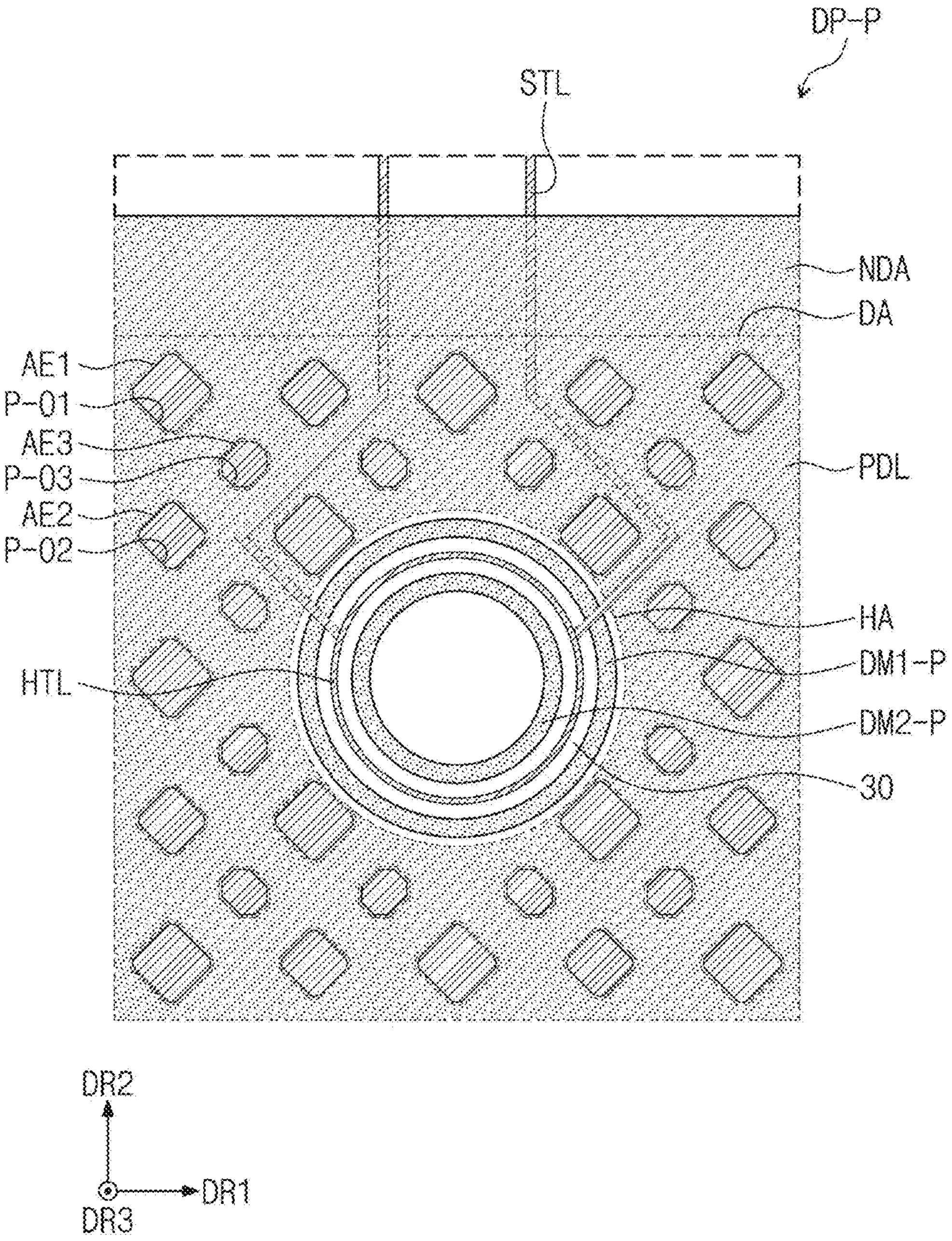

FIGS. 10A through 10C are plan views illustrating a method of manufacturing the display panel according to one or more embodiments of the present disclosure. FIGS. 10A to 10C show plan views of the preliminary display panel DP-P in various processes of the manufacturing method of the display panel.

FIG. 10A shows the preliminary display panel DP-P before pixel electrodes AE1, AE2, and AE3 (e.g., refer to FIG. 10B) are formed. Referring to FIG. 10A, preliminary dams DM1-P and DM2-P may be disposed in the hole area HA. The preliminary dams DM1-P and DM2-P may correspond to the dam portions of the dams DM1 and DM2 (e.g., refer to FIG. 5A). As an example, the preliminary dams DM1-P and DM2-P may correspond to the first dam portion L1 (e.g., refer to FIG. 5A).

FIG. 10A shows the preliminary display panel DP-P before the hole HH (e.g., refer to FIG. 4) is formed in the hole area HA. The hole HH may be formed by forming the encapsulation layer TFE (e.g., refer to FIG. 5A) on the preliminary display panel DP-P, and removing a portion of the encapsulation layer TFE and the preliminary display panel DP-P in hole area HA.

The fourth insulating layer 40 may be disposed on the preliminary display panel DP-P. The fourth insulating layer 40 may provide a base surface on which the pixel electrodes AE1, AE2, and AE3 (e.g., refer to FIG. 10B) are disposed. The fourth insulating layer 40 may be disposed entirely over the display area DA. The fourth insulating layer 40 may be disposed in at least a portion of the non-display area NDA. As an example, an end of the fourth insulating layer 40 may be disposed in the non-display area NDA.

The fourth insulating layer 40 may be spaced apart from the hole area HA. Accordingly, at least a portion in the hole area HA of an upper surface of the third insulating layer 30 disposed under the fourth insulating layer 40 may be exposed without being covered by the fourth insulating layer 40. As the fourth insulating layer 40 including the organic layer is disposed to be spaced apart from the hole area HA, moisture may be prevented or substantially prevented from entering through the hole HH formed through a subsequent process.

Referring to FIG. 10B, the pixel electrodes AE1, AE2, and AE3 may be formed on the fourth insulating layer 40 of the preliminary display panel DP-P. The pixel electrodes AE1, AE2, and AE3 may be formed by depositing and patterning a conductive layer. The pixel electrodes AE1, AE2, and AE3 may correspond to the pixel electrode AE (e.g., refer to FIG. 5A) of the above-described light emitting element OL.

The pixel electrodes AE1, AE2, and AE3 may be spaced apart from each other on the fourth insulating layer 40. Areas in which the pixel electrodes AE1, AE2, and AE3 are disposed may correspond to areas in which the pixels PX are disposed, respectively.

The pixel electrodes AE1, AE2, and AE3 may include first, second, and third pixel electrodes AE1, AE2, and AE3. The first, second, and third pixel electrodes AE1, AE2, and AE3 may be configurations of the light emitting elements that emit different colored light from each other. As an example, the first pixel electrode AE1 may be a pixel electrode of a light emitting element from emitting a first color light, the second pixel electrode AE2 may be a pixel electrode of a light emitting element for emitting a second color light different from the first color light, and the third pixel electrode AE3 may be a pixel electrode of a light emitting element for emitting a third color light different from the first color light and the second color light.

The first, second, and third pixel electrodes AE1, AE2, and AE3 may have different sizes from each other. From among the first, second, and third pixel electrodes AE1, AE2, and AE3, the first pixel electrode AE1 may have the largest size. The sizes of the first, second, and third pixel electrodes AE1, AE2, and AE3 may be designed by taking into account a size of the light emitting area and the color of light exiting from the light emitting area, but the present disclosure is not limited thereto or thereby. In an embodiment, the first, second, and third pixel electrodes AE1, AE2, and AE3 may have the same or substantially the same size as each other.

The heating line HTL and the signal transmission line STL may be formed through the same process as that of the pixel electrodes AE1, AE2, and AE3. As an example, the heating line HTL, the signal transmission line STL, and the pixel electrodes AE1, AE2, and AE3 may be formed by patterning the same conductive layer. Accordingly, the heating line HTL and the signal transmission line STL may be disposed at (e.g., in or on) the same layer as that of the pixel electrodes AE1, AE2, and AE3. The heating line HTL and the signal transmission line STL may include the same material as that of the pixel electrodes AE1, AE2, and AE3, however, the present disclosure is not limited thereto or thereby. According to an embodiment, the heating line HTL and the signal transmission line STL may be formed through a process different from the process of forming the pixel electrodes AE1, AE2, and AE3. As an example, after the heating line HTL and the signal transmission line STL are formed on the third insulating layer 30, the pixel electrodes AE1, AE2, and AE3 may be formed on the fourth insulating layer 40.

The heating line HTL may be disposed in the hole area HA. As an example, the heating line HTL may be disposed between the preliminary dams DM1-P and DM2-P in the hole area HA. The heating line HTL may be spaced apart from the fourth insulating layer 40. The heating line HTL may have the closed-loop shape. The hole HH (e.g., refer to FIG. 4) to be formed in a subsequent process may be formed in an inner area of the heating line HTL.

The signal transmission line STL may extend from the heating line HTL to the outside of the display area DA. The end of the signal transmission line STL may be exposed without being covered by the fourth insulating layer 40. A portion of the signal transmission line STL extending via the display area DA may overlap with the fourth insulating layer 40.

The signal transmission line STL may be disposed between the pixel electrodes AE1, AE2, and AE3 in the display area DA. In other words, the signal transmission line STL may be spaced apart from the pixel electrodes AE1, AE2, and AE3 in the display area DA. The signal transmission line STL may be designed to have the line width equal to or smaller than a distance between the pixel electrodes AE1, AE2, and AE3. Accordingly, the signal transmission line STL may be electrically insulated from the pixel electrodes AE1, AE2, and AE3.

The signal transmission line STL may include the bent portion. Because the signal transmission line STL is formed between the pixel electrodes AE1, AE2, and AE3, the signal transmission line STL may include the bent portion according to the shape and arrangement of the pixel electrodes AE1, AE2, and AE3. Even though the signal transmission line STL includes the bent portion, the current may be applied to the heating line HTL without concentration of heat at the bent portion, since the signal transmission line STL has the line width sufficient to apply the current.

Referring to FIG. 10C, the pixel definition layer PDL may be formed on the preliminary display panel DP-P on which the pixel electrodes AE1, AE2, and AE3 are formed. The pixel definition layer PDL may be disposed on the fourth insulating layer 40 (e.g., refer to FIG. 10B).

The pixel definition layer PDL may be provided with a plurality of light emitting openings P-O1, P-O2, and P-O3 defined therethrough. The light emitting openings P-O1, P-O2, and P-O3 may be formed through the pixel definition layer PDL. The light emitting openings P-O1, P-O2, and P-O3 may correspond to the above-described light emitting opening P-O (e.g., refer to FIG. 5A).

The light emitting openings P-O1, P-O2, and P-O3 may overlap with the first, second, and third pixel electrodes AE1, AE2, and AE3, respectively. At least a portion of each of the pixel electrodes AE1, AE2, and AE3 may be exposed through a corresponding opening of the light emitting openings P-O1, P-O2, and P-O3 overlapping therewith. The portions of the pixel electrodes AE1, AE2, and AE3 exposed through the light emitting openings P-O1, P-O2, and P-O3 may be defined as light emitting areas.

The light emitting openings P-O1, P-O2, and P-O3 may have various suitable opening sizes according to the sizes of the pixel electrodes AE1, AE2, and AE3. As an example, a first light emitting opening P-O1 overlapping with the first pixel electrode AE1 having the largest size may have the largest opening size from among the light emitting openings P-O1, P-O2, and P-O3.

The pixel definition layer PDL may be spaced apart from the hole area HA. Accordingly, the heating line HTL may be exposed without being covered by the pixel definition layer PDL. Thus, the preliminary common control layer EL-P (e.g., refer to FIG. 11B) to be formed on the pixel definition layer PDL may be in contact with the heating line HTL in the hole area HA, and may receive the heat from the heating line HTL.

The end of the signal transmission line STL may be exposed without being covered by the pixel definition layer PDL. The end of the signal transmission line STL exposed without being covered by the fourth insulating layer 40 (e.g., refer to FIG. 10B) and the pixel definition layer PDL may provide the point to which the power supply device is connected, and the voltage may be applied to the heating line HTL through the point. The end of the signal transmission line STL may not overlap with the pixel definition layer PDL, but a portion of the signal transmission line STL extending via the display area DA may overlap with the pixel definition layer PDL.

The manufacturing method of the display panel according to one or more embodiments of the present disclosure may include a process of forming the common control layer, which is spaced apart from the heating line, from the preliminary common control layer. The common control layer may be formed by generating the heat in the heating line to remove the portion of the preliminary common control layer formed on the pixel electrode and the heating line, which corresponds to the heating line. This will be described in more detail below with reference to FIGS. 11A through 11D.

FIGS. 11A through 11D are cross-sectional views illustrating a method of manufacturing the display panel according to one or more embodiments of the present disclosure. FIGS. 11A to 11D show cross-sections of the preliminary display panel DP-P in various processes of the manufacturing method of the display panel.

Figure 11A:
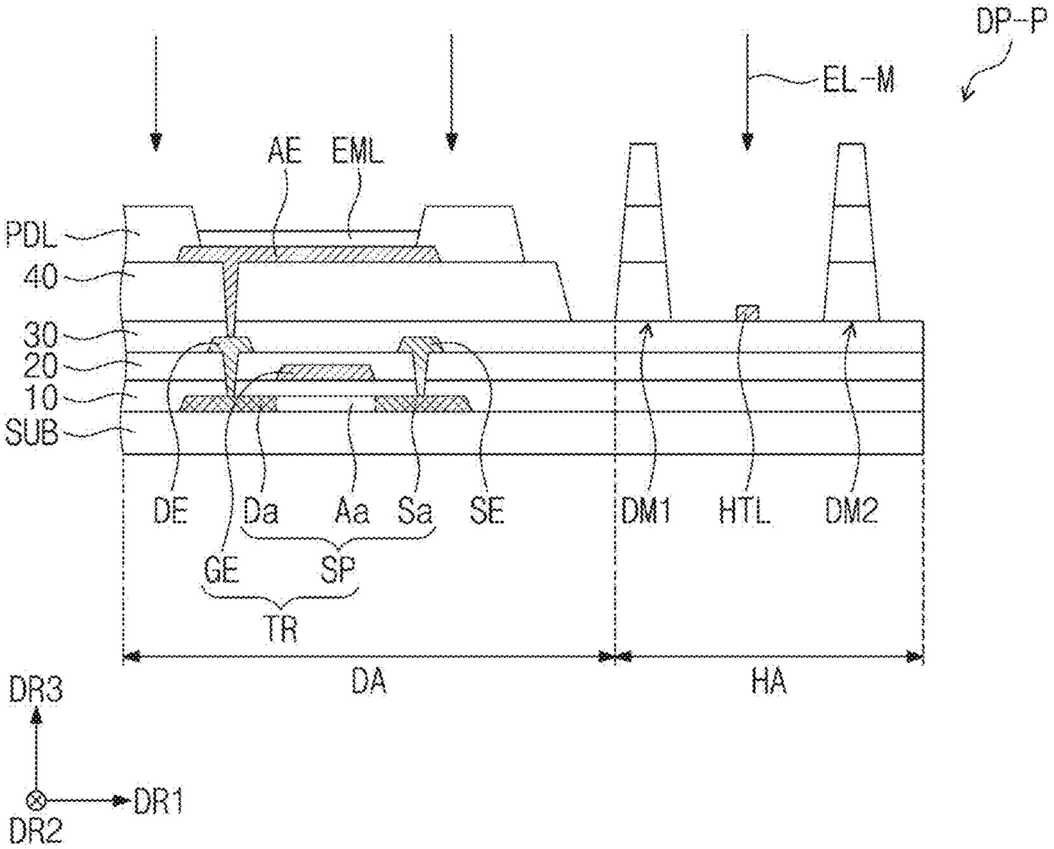
FIGS. 11A through 11D are cross-sectional views illustrating a method of manufacturing a display panel according to one or more embodiments of the present disclosure.
Figure 11B:
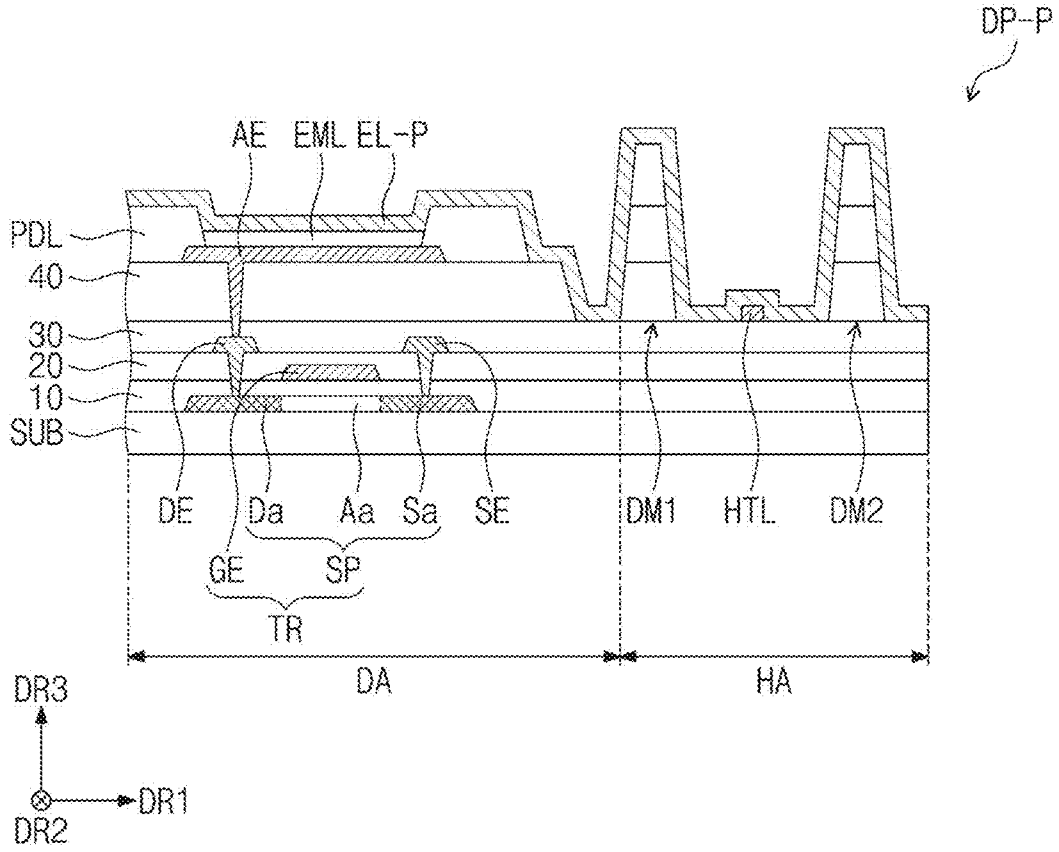
Figure 11C:
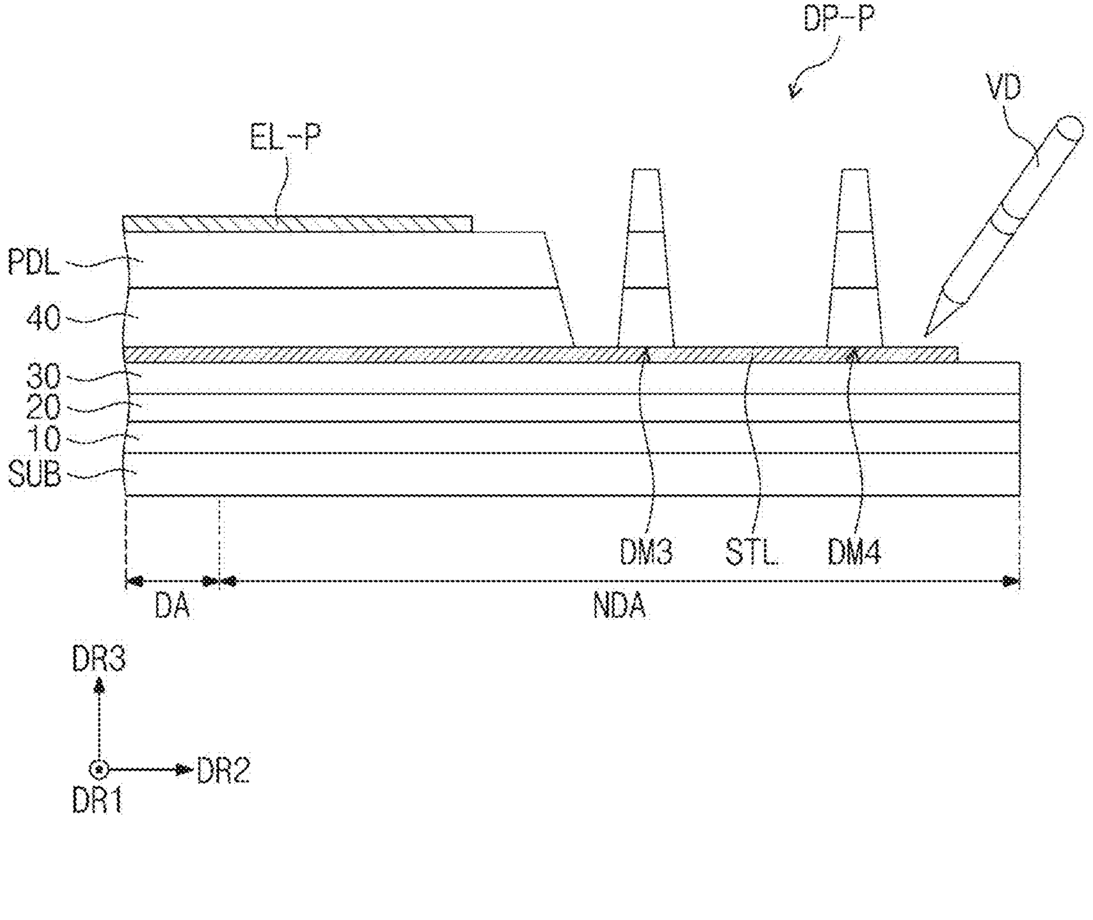
Figure 11D:
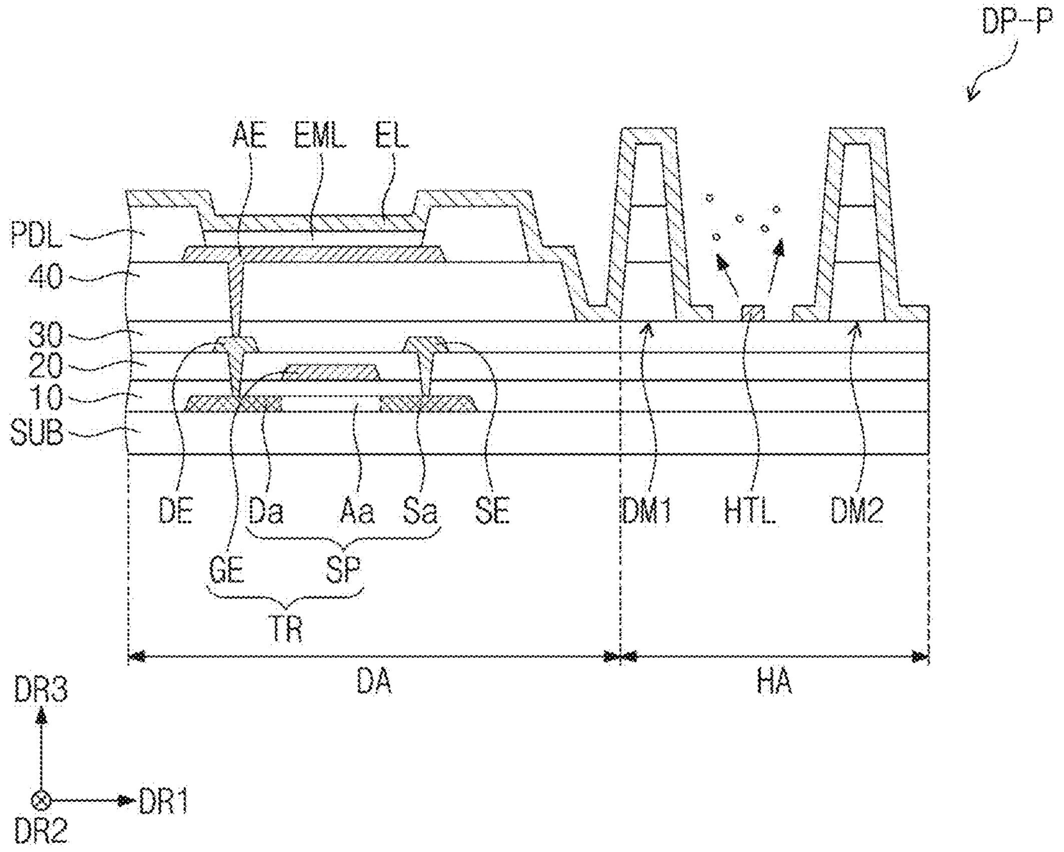

FIG. 11A shows a process of depositing the preliminary common control layer EL-P (e.g., refer to FIG. 11B) to form the common control layer EL (e.g., refer to FIG. 11D). FIG. 11B shows the preliminary display panel DP-P on which the preliminary common control layer EL-P is deposited.

Referring to FIGS. 11A and 11B, a deposition material EL-M may be deposited on the preliminary display panel DP-P on which the pixel electrode AE and the heating line HTL are formed to form the preliminary common control layer EL-P. The preliminary common control layer EL-P may be disposed on the pixel electrode AE, the light emitting layer EML, and the pixel definition layer PDL.

The preliminary common control layer EL-P may be disposed in the hole area HA. The preliminary common control layer EL-P may be disposed between the dams DM1 and DM2, and may be in contact with the heating line HTL. The voltage may be applied to the heating line HTL to generate the heat, and thus, a portion of the preliminary common control layer EL-P, which is in contact with the heating line HTL, may be removed.

FIG. 11C shows a process of applying the voltage to the signal transmission line STL. The end of the signal transmission line STL may be spaced apart from the fourth insulating layer 40, the pixel definition layer PDL, and the preliminary common control layer EL-P. The end of the signal transmission line STL may be exposed to the outside. The power supply device VD may be disposed on the end of the signal transmission line STL, and may apply the voltage to the signal transmission line STL.

A pulse voltage may be applied to the signal transmission line STL. An instantaneous pulse voltage of about 10 microseconds to about 100 microseconds may be applied to the signal transmission line STL. The signal transmission line STL may transmit the voltage to the heating line HTL (e.g., refer to FIG. 11D) connected to the signal transmission line STL. As a result, the heat may be generated in the heating line HTL due to the wiring resistance. The heating line HTL may have the line width smaller than that of the signal transmission line STL, and thus, enough heat to selectively remove the preliminary common control layer EL-P may be generated in the heating line HTL.

As the voltage is directly applied to the signal transmission line STL to generate the heat in the heating line HTL, the voltage may be prevented or substantially prevented from affecting other conductors in the preliminary display panel DP-P. In a case where the heating line HTL is heated by an induced current method rather than a pulse voltage application method, the current may flow through other conductors or lines in the preliminary display panel DP-P. However, according to an embodiment of the present disclosure, because the voltage is directly applied to the signal transmission line STL without using the induced current method, the voltage may be applied to the heating line HTL without affecting other conductors or lines in the preliminary display panel DP-P. In addition, the signal transmission line STL and the heating line HTL may be electrically insulated from the pixels PX, and thus, the signal transmission line STL and the heating line HTL may not affect electrical characteristics of the pixels PX.

The heat may be generated in the heating line HTL by applying the voltage to the signal transmission line STL. The heating line HTL may generate enough heat to sublimate or vaporize the preliminary common control layer EL-P. In a case where the preliminary common control layer EL-P, which is to be removed, is spaced apart (e.g., separated) from the heating line HTL, which is the source of the heat, with an additional layer interposed therebetween, the heating line HTL may be required to generate more heat. However, according to one or more embodiments of the present disclosure, the preliminary common control layer EL-P may be in contact with the heating line HTL, and thus, the portion of the preliminary common control layer EL-P may be efficiently removed by the heat generated from the heating line HTL.

FIG. 11D shows a process of forming the common control layer EL from the preliminary common control layer EL-P. Due to the heat generated in the heating line HTL, the portion of the preliminary common control layer EL-P, which corresponds to the area in which the heating line HTL is deposed, may be sublimated or vaporized. Accordingly, the continuity of the common control layer EL may be blocked in the area where the heating line HTL is disposed. In other words, the continuity of the common control layer EL may be blocked in the hole area HA. Because the continuity of the common control layer EL is blocked, the foreign substances, moisture, and/or oxygen from the outside of the hole HH (e.g., refer to FIG. 4) may be prevented or substantially prevented from entering the display area DA via the common control layer EL.

According to one or more embodiments of the present disclosure, the continuity of the common control layer EL may be blocked using the heating line HTL disposed in the hole area HA. Accordingly, a process of using an expensive laser process to block the continuity of the common control layer EL may be omitted in the manufacturing method of the display panel, and thus, process costs may be reduced. In addition, because the portion of the preliminary common layer EL-P is removed using the heating line HTL, a structure, such as the undercut, the reverse tapered spacer, or the groove, which may be used to block the continuity of the common control layer EL, may be omitted. Accordingly, a margin of the hole area HA may be reduced, and the display area DA may be increased.

is not limited is not limited The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:

a base substrate comprising a display area, and a hole area having a hole defined therein;

a light emitting element in the display area, and comprising:

a pixel electrode on the base substrate;

a light emitting layer on the pixel electrode; and a common control layer on the pixel electrode;

a heating line surrounding the hole in the hole area; and a signal transmission line connected to the heating line, and electrically insulated from the light emitting element, wherein the common control layer is spaced from the heating line.

2. The display panel of claim 1, wherein the heating line has a line width smaller than a line width of the signal transmission line.

3. The display panel of claim 1, wherein the heating line comprises at least one of molybdenum (Mo), copper (Cu), tungsten (W), gold (Au), silver (Ag), indium tin oxide (ITO), indium zinc oxide (IZO), or indium tin gallium oxide (ITGO).

4. The display panel of claim 1, wherein the heating line comprises the same material as that of the pixel electrode.

5. The display panel of claim 1, wherein the heating line comprises the same material as that of the signal transmission line.

6. The display panel of claim 1, wherein the heating line has a closed-loop shape corresponding to an outer line of the hole.

7. The display panel of claim 1, wherein the common control layer further comprises a protruding portion adjacent to an end of the common control layer facing the heating line.

8. The display panel of claim 1, wherein the signal transmission line is located at the same layer as that of the pixel electrode.

9. The display panel of claim 1, wherein the signal transmission line extends from the heating line via the display area, and the signal transmission line is spaced from the pixel electrode in the display area.

10. The display panel of claim 1, wherein a portion of the signal transmission line overlaps with the common control layer, and an end of the signal transmission line does not overlap with the common control layer.

11. The display panel of claim 1, further comprising a pixel definition layer on the pixel electrode, and defining a light emitting opening overlapping with the pixel electrode, wherein the signal transmission line overlaps with the pixel definition layer, and the heating line does not overlap with the pixel definition layer.

12. The display panel of claim 1, wherein the common control layer comprises at least one of a hole control layer or an electron control layer on the light emitting layer.

13. The display panel of claim 1, further comprising a dam surrounding the hole in the hole area, wherein the heating line is spaced from the dam.

14. The display panel of claim 13, wherein the dam comprises:

a first dam; and a second dam located closer to the hole compared to the first dam, and wherein the heating line is located between the first dam and the second dam in the hole area.

15. The display panel of claim 1, further comprising a barrier portion in contact with a rear surface of the heating line, wherein the barrier portion has a thermal conductivity lower than a thermal conductivity of the heating line.

16. The display panel of claim 15, wherein the barrier portion surrounds the hole to correspond to a location of the heating line.

17. The display panel of claim 15, wherein the barrier portion covers at least a portion of a side surface of the heating line.

18. The display panel of claim 15, wherein the barrier portion comprises at least one of titanium (Ti), lead (Pb), aluminum oxide (AlOx), polyimide (PI), silicon oxide (SiOx), or silicon nitride (SiNx).

* * * * *